United States Patent
Sergent et al.

(10) Patent No.: US 9,790,325 B2
(45) Date of Patent: Oct. 17, 2017

(54) METALLOPOLYMERS AND USE THEREOF

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE—CNRS, Paris (FR); ECOLE POLYTECHNIQUE, Palaiseau (FR)

(72) Inventors: Alessandra Sergent, Paris (FR); Gael Zucchi, Gif sur Yvette (FR); Denis Tondelier, Massy (FR); Bernard Geffroy, L'hay les Roses (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE—CNRS, Paris (FR); ECOLE POLYTECHNIQUE, Palaiseau (FR)

( * ) Notice: Subject to any disclaimer, the term of this patent is extended or adjusted under 35 U.S.C. 154(b) by 12 days.

(21) Appl. No.: 14/766,605

(22) PCT Filed: Feb. 7, 2014

(86) PCT No.: PCT/FR2014/050234
§ 371 (c)(1),
(2) Date: Aug. 7, 2015

(87) PCT Pub. No.: WO2014/122406
PCT Pub. Date: Aug. 14, 2014

(65) Prior Publication Data
US 2015/0376337 A1    Dec. 31, 2015

(30) Foreign Application Priority Data
Feb. 7, 2013 (FR) ..................... 13 51073

(51) Int. Cl.
*H01L 51/00* (2006.01)
*C08G 73/06* (2006.01)
(Continued)

(52) U.S. Cl.
CPC ....... *C08G 73/0672* (2013.01); *C08G 61/124* (2013.01); *C09K 11/06* (2013.01);
(Continued)

(58) Field of Classification Search
CPC .................. H01L 51/0089; C08G 73/0672
(Continued)

(56) References Cited

U.S. PATENT DOCUMENTS

2002/0193532 A1* 12/2002 Ikehira ................ C08G 61/02
                                              525/333.3
2005/0147843 A1*  7/2005 Kobayashi ........... C07F 9/5045
                                              428/690
(Continued)

FOREIGN PATENT DOCUMENTS

WO    2004/070772 A1    8/2004
WO    2004/113468 A1    12/2004

OTHER PUBLICATIONS

Zhang et al.: "Synthesis and electroluminescent properties of a carbozole-functionalized europium(III) complex", Journal of Luminescence, Elsevier BV North-Holland, NL, vol. 126, No. 2, May 17, 2007 (May 17, 2007), pp. 682-686, XP022082786, ISSN: 0022-2313, DOI: 10.1016/J.JLUMIN.2006.10.025 p. 682-p. 686.
(Continued)

*Primary Examiner* — Mike M Dollinger
(74) *Attorney, Agent, or Firm* — Young & Thompson

(57) ABSTRACT

Metallopolymers of formula (I) where $R^1$ and $R^{1'}$; and $R^2$ and $R^{2'}$ are independently of each other, a $C_2$-$C_{10}$ alkyl group; X is CR3R3' or NR4; $R^3$ and $R^{3'}$ are, independently of each other, as is $R^4$, a $C_2$-$C_{10}$ alkyl group; L is a $C_4$-$C_{10}$ alkylene group; $Ln^1$ and $Ln^2$ are, independently of each other, chosen from the lanthanide cations; $L^1$ and $L^2$ are, independently of each other, chosen from the α-diketonate ligands; T is a neutral bidentate Lewis base including two coordinating nitrogen atoms; → represents a coordination of group T via the two nitrogen atoms of T to $Ln^1$ and $Ln^2$ respectively; $Ln^1$ and $Ln^2$ are, independently of each other, chosen from the lanthanide cations; $L^1$ and $L^2$ are, indepen-
(Continued)

dently of each other, chosen from the β-diketonate, picolinate or dipicolinate monoanionic ligands; 0.01<x<0.50; 0<y<0.49, with x+y=0.50.

17 Claims, 4 Drawing Sheets

(51) Int. Cl.
    *C08G 61/12*     (2006.01)
    *C09K 11/06*     (2006.01)
    *H01L 51/50*     (2006.01)

(52) U.S. Cl.
    CPC ...... *H01L 51/0036* (2013.01); *H01L 51/0043* (2013.01); *H01L 51/0089* (2013.01); *C08G 2261/1523* (2013.01); *C08G 2261/3142* (2013.01); *C08G 2261/3241* (2013.01); *C08G 2261/5242* (2013.01); *C08G 2261/95* (2013.01); *C09K 2211/1466* (2013.01); *H01L 51/0039* (2013.01); *H01L 51/5012* (2013.01)

(58) Field of Classification Search
    USPC ....................................................... 525/540
    See application file for complete search history.

(56) References Cited

U.S. PATENT DOCUMENTS

| 2006/0149022 | A1* | 7/2006 | Parham | C08G 61/124 |
| | | | | 528/102 |
| 2006/0284140 | A1 | 12/2006 | Breuning et al. | |
| 2011/0195176 | A1* | 8/2011 | Wallace | H01L 51/0037 |
| | | | | 427/58 |
| 2012/0140439 | A1* | 6/2012 | Hasegawa | C07F 9/5329 |
| | | | | 362/84 |

OTHER PUBLICATIONS

Du et al: "Novel chemosensory materials based on polyfluorenes with 2-(2'-pyridyl)-benzimidazole and 5-methyl-3-(pyridin-2-yl)-1,2,4-triazole groups in the side chain", Polymer, Elsevier Science Publishers B.V, GB, vol. 48, No. 5, Feb. 16, 2007 (Feb. 16, 2007), pp. 1245-1254, XP005892688, ISSN: 0032-3861, DOI: 10.1016/J.Polymer.2007.01.011 p. 1245-p. 1254.
Shu-Juan Liu et al.: "Conjugated polymers with cationic iridium(iii) complexes in the side-chain for flash memory devices utilizing switchable through-space charge transfer",Journal of Materials Chemistry, vol. 22, No. 43, Jan. 1, 2012 (Jan. 1, 2012), p. 22964, XP055074322, ISSN: 0959-9428, DOI: 10.1039/c2jm31963b p. 22964-p. 22970.
Kezhi Wang et al.: "Optical properties of the highly ordered Langmuir-Blodgett film of a strongly luminescent Eu(III) complex", Journal of Photochemistry and Photobiology A: Chemistry, vol. 156, No. 1-3, Mar. 1, 2003 (Mar. 1, 2003), pp. 39-43, XP055074261, ISSN: 1010-6030, DOI: 10.1016/SIOI0-6030(02)00437-9 p. 39-p. 43.
Lili Chen et al.: "Red- and white-emitting organic light-emitting diodes based on trimetallic dendritic europium (III) complex: Eu3(DBM)9(TMMB)", Solid-State Electronics, vol. 69, Mar. 1, 2012 (Mar. 1, 2012), pp. 67-71, XP055074266, ISSN: 0038-1101, DOI: 10.1016/j.sse.2011.12.005 p. 67-p. 71.
Wang K et al.: "An Alkylated Europium(III) Complex for Photoelectric Devices", Solid State Communications, Pergamon, GB, vol. 122, No. 3/04, Jan. 1, 2002 (Jan. 1, 2002), pp. 233-236, XP008043906, ISSN: 0038-1098, DOI: 10.1016/50038-1098(02)00082-0 p. 233-p. 236.
Zhang et al.: "Synthesis and photovoltaic properties of new europium complex Eu(DBM)3(CPyBM)", Chinese Chemical Letters, Elsevier Ltd, GB, vol. 18, No. 3, Feb. 23, 2007 (Feb. 23, 2007), pp. 333-336, XP005943360, ISSN: 1001-8417, DOI: 10.1016/J.CCLET.2007.01.026 p. 333-p. 336.
Du Bin et al: "High-efficiency electrophosphorescent copolymers containing charged iridium complexes in the side chains", Chemistry—A European Journal, Wiley—V C H Verlag Gmbh & Co. KGAA, Weinheim, DE • vol. 13, No. 26 Jan. 1, 2007 (Jan. 1, 2007), pp. 7432-7442, XP008164024, ISSN: 0947-6539, DOI: 10.1002/CHEM.200601811 Retrieved from the Internet: URL:http://www3.interscience.wiley.com/cgi -bin/issn?DESCRIPTOR=PRINTISSN &VALUE=0947-6539 [retrieved on Jun. 21, 2007] p. 7432-p. 7442.
Jian Pei et al.: "Efficient Energy Transfer to Achieve Narrow Bandwidth Red Emission from Eu3+-Grafting Conjugated Polymers", Macromolecules 2002, 35, 7274-7280, Published on Web Aug. 13, 2002, Received Apr. 2, 2002; Revised Manuscript Received Jul. 3, 2002.
International Search Report, dated Aug. 14, 2014, from corresponding PCT application.

* cited by examiner

METALLOPOLYMERS AND USE THEREOF

This invention relates to new metallopolymers, their preparation as well as their use in light-emitting diodes.

Organic light-emitting diodes (OLED in English: organic light-emitting diode) have achieved great success since they were put on the market toward the end of the 1990s. Today, they are being used more and more for devices of the advertising field.

The optimized structure of an organic light-emitting diode comprises several layers of active materials. It has a series of materials stacked between two electrodes, as shown in FIG. 1. A transparent anode, generally ITO, with a thickness of 100 nm, is deposited on a substrate S. A fine layer (10 nm) of a material that promotes the injection of holes (HIL for hole injecting layer) is then deposited in front of the hole transporting layer (HTL for hole transporting layer). The emitting layer with a thickness of approximately 50 nm is then deposited, and then 10 nm of a hole blocking layer (HBL for hole blocking layer), and 10 nm of an electron transporting layer (ETL for electron transporting layer). Finally, the cathode C with a thickness of approximately 100 nm is deposited.

In this type of structure, the materials that are used are organic molecules that can be sublimated. They are deposited by a thermal evaporation process under ultra-high vacuum. This process is not only costly in terms of energy but it is not viable for the development of devices on large substrates.

The light-emitting diodes that are based on soluble polymers (PLED in English: polymer light-emitting diode) are also developed for ease of use by liquid means of these polymers, making it possible to use less costly deposition techniques and to employ flexible and/or large substrates. The PLEDs comprise an emitting layer that consists of a single semi-conductive and luminescent polymer, a mixture of polymers, or a polymer that is doped by a luminescent molecular compound.

The light-emitting semi-conductive polymer can be a metallopolymer. In terms of this invention, the term "metallopolymer" is defined as an organic polymer that is connected to a metal complex whose center is a lanthanide-type ion. In particular, the polymer chain can be conjugated, and the metal ion can be attached to the polymer skeleton in a non-conjugated manner. The metallopolymers comprising a conjugated chain can benefit from additional advantages such as properties of emission and conduction inherent to the conjugation.

Pei et al. (Pei, J.; Liu, X.-L.; Yu, W.-L.; Lai, Y.-H.; Niu, Y.-H.; Cao, Y., Macromolecules, 2002, 35, 7274-7280) describe a metallopolymer that comprises a conjugated chain that consists of alternating fluorene units and phenyl units with a (2,2'-bipyrid-5-yl)-nonyloxy pendant group on each of the phenyl units. The 2,2'-bipyridyl group is used as a coordination site for a europium complex. The polymer light-emitting diode that is manufactured with this polymer emits in the red range.

The synthesis means used in the document cited above does not make it possible to know what quantity of lanthanide ion has been grafted within the polymer. The variation of the lanthanide ion level is brought about only by changing the quantities of material used at the beginning of synthesis and does not depend on the group level making the coordination possible. The lanthanide ion level is therefore inserted in a totally random manner. In addition, the authors describe a transfer of energy from the polymer chain to the lanthanide ion, which completely cancels out the emission of light from the polymer and consequently has the single red emission of the europium.

There is always a need for new metallopolymers that offer the possibility of modulating the properties of conduction (positive and negative charges) and emission (ratio between the emission of the conjugated chain of the polymer and that of the metal centers) and that can be easily shaped, in particular by means of solution deposition techniques.

It is thus to the credit of the applicant to have developed new multifunctional hybrid metallopolymers that comprise a conjugated chain formed by fluorene and carbazole units that play the dual role of blue emitter and hole transporter. In these polymers, all or part of the carbazole units are substituted at the level of the nitrogen atom by electron transporter groups that serve at the same time as the coordination site of lanthanide ions.

One object of this invention therefore relates to a metallopolymer that consists of repeat units of Formula I

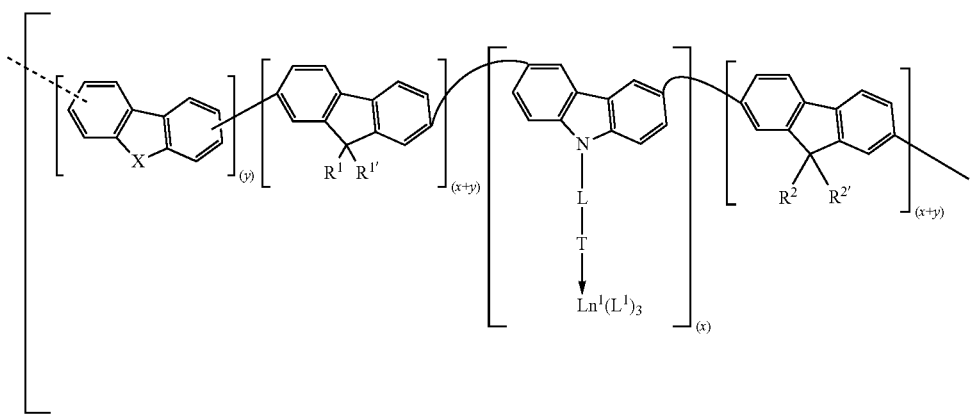

Formula I

-continued

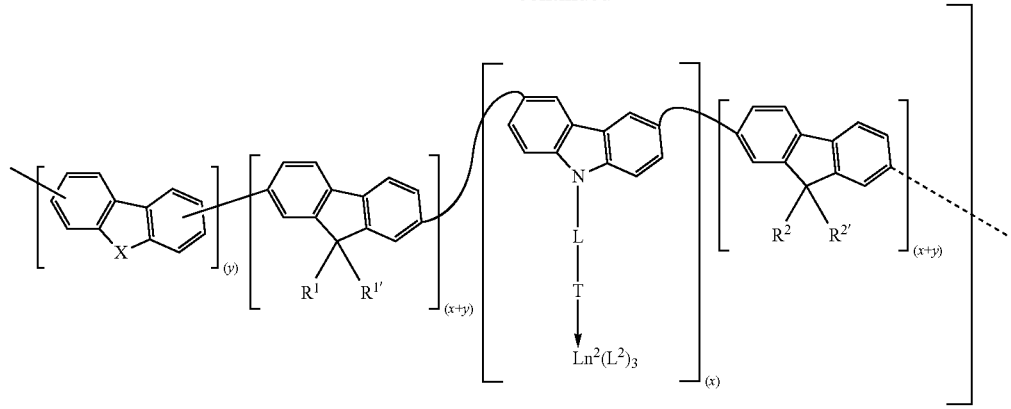

in which $R^1$ and $R^{1'}$ are, independently of one another, a $C_2$-$C_{10}$ alkyl group, preferably a $C_6$-$C_8$ alkyl group;

$R^2$ and $R^{2'}$ are, independently of one another, a $C_2$-$C_{10}$ alkyl group, preferably a $C_6$-$C_8$ alkyl group;

X is $CR^3R^{3'}$ or $NR^4$;

$R^3$ and $R^{3'}$ are, independently of one another, a $C_2$-$C_{10}$ alkyl group, preferably a $C_6$-$C_8$ alkyl group;

$R^4$ is a $C_2$-$C_{10}$ alkyl group, preferably a $C_6$-$C_8$ alkyl group;

L is a $C_4$-$C_{10}$ alkylene group, preferably a $C_4$-$C_6$ alkylene group;

T is a neutral bidentate Lewis base that comprises two coordinating nitrogen atoms;

→ represents a coordination of the group T via the two nitrogen atoms from T to $Ln^1$ and $Ln^2$ respectively;

$Ln^1$ and $Ln^2$ are, independently of one another, selected from among the lanthanide cations;

$L^1$ and $L^2$ are, independently of one another, selected from among the β-diketonate, picolinate or dipicolinate monoanionic ligands;

x is between 0.01 and 0.50;

y is between 0 and 0.49, with the sum of x+y being equal to 0.50.

The metallopolymers of the invention first have the advantage of comprising transporter groups of two types of feedstocks. The conjugated chain that consists of fluorene and carbazole groups can be used as a blue emitter and preferably transports the holes. The connections between the different units of the conjugated chain of the metallopolymer according to the invention are made in the 3- and 6-positions on the carbazole units and in the 2- and 7-positions on the fluorene units.

The use of lanthanides is advantageous since it makes it possible to obtain particularly advantageous emission properties. Because of the very fine emission lines of the lanthanides, the color emitted by the latter is extremely pure. In addition, the emission color is specific to each lanthanide ion, and it is not influenced by the chemical environment contrary to the other elements d. Thus, regardless of the organic group that is present around the lanthanide ion, the emission color of this ion will always be the same. From an economic standpoint, the use of lanthanide ions is also very advantageous. The lanthanide salts that are used for obtaining metallopolymers are much less costly than those of their homologs with the other type-d transition metals such as Ta, W, Ir, Pt, Au, and Hg. By way of example, with equal purity and quantity, the europium chloride costs ten times less than the iridium chloride.

In a general manner, all of the trivalent lanthanide cations can be used. $Ln^1$ and $Ln^2$ can therefore be selected independently of one another from among the trivalent cations of lanthanum ($La^{3+}$), cerium ($Ce^{3+}$), praseodymium ($Pr^{3+}$), neodymium ($Nd^{3+}$), samarium ($Sm^{3+}$), europium ($Eu^{3+}$), gadolinium ($Gd^{3+}$), terbium ($Tb^{3+}$), dysprosium ($Dy^{3+}$), holmium ($Ho^{3+}$), erbium ($Er^{3+}$), thulium ($Tm^{3+}$), ytterbium ($Yb^{3+}$), and lutecium ($Lu^{3+}$), in particular from among $Eu^{3+}$, $Tb^{3+}$, $Tm^{3+}$, $Dy^{3+}$, $Sm^{3+}$, $Nd^{3+}$, $Yb^{3+}$, and $Er^{3+}$.

For the design of light-emitting diodes, the lanthanide ions that emit in the red range, in the green range, in the blue range, in the yellow range, and in the orange range are particularly advantageous. From this standpoint, $Ln^1$ and $Ln^2$ are preferably selected from among $Eu^{3+}$, $Tb^{3+}$, $Tm^{3+}$, $Dy^{3+}$, and $Sm^{3+}$. Also preferably, $Ln^1$ and $Ln^2$ are selected from among $Eu^{3+}$ and $Tb^{3+}$, i.e., one from $Ln^1$ and $Ln^2$ is $Eu^{3+}$ and the other is $Tb^{3+}$, or $Ln^1$ and $Ln^2$ are both $Eu^{3+}$ or both $Tb^{3+}$. When white light is desired, one from $Ln^1$ and $Ln^2$ is preferably $Eu^{3+}$ and the other is $Tb^{3+}$.

The β-diketonate ligands $L^1$ and $L^2$ are advantageously selected independently of one another from the group that consists of benzoylacetonate (bzac), benzoyltrifluoroacetonate (btfac), dibenzoylmethanate (dbm), hexafluoroacetylacetonate (hfac), 2-thenoyltrifluoroacetonate (tta), 2,2,6,6-tetramethyl-3,5-heptanedione (thd), 6,6,7,7,8,8,8-heptafluoro-2,2-dimethyl-3,5-octanedionate and acetylacetonate (acac). The picolinate and dipicolinate ligands are functionalized in such a way as to be respectively bi- and tri-dentates for the lanthanide ions. One skilled in the art will know to select the ligands that are suitable based on the lanthanide ion. Thus, for example, dbm and/or tta will preferably be used in the case of $Eu^{3+}$, and acac or a picolinate will preferably be used in the case of $Tb^{3+}$.

In one embodiment, $Ln^1$ and $Ln^2$ are both $Eu^{3+}$, and $L^1$ and $L^2$ are both tta.

In another embodiment, $Ln^1$ is $Eu^{3+}$ and $Ln^2$ is $Tb^{3+}$, and $L^1$ and $L^2$ are both tta.

$R^1$ and $R^{1'}$ can be different or identical; preferably, they are identical. $C_6$-$C_8$ linear alkyl groups will advantageously be selected: n-hexyl, n-heptyl, n-octyl, and preferably n-octyl.

$R^2$ and $R^{2'}$ can be different or identical; preferably, they are identical. $C_6$-$C_8$ linear alkyl groups will advantageously be selected: n-hexyl, n-heptyl, n-octyl, and preferably n-octyl.

Advantageously, $R^1$, $R^{1'}$, $R^2$ and $R^{2'}$ are identical; preferably, they are all n-octyl.

R³ and R³' can be different or identical; preferably, they are identical. Advantageously, $C_6$-$C_8$ linear alkyl groups will be selected: n-hexyl, n-heptyl, n-octyl, and preferably n-hexyl.

R⁴ is advantageously a $C_6$-$C_8$ linear alkyl group: n-hexyl, n-heptyl, n-octyl, and preferably n-hexyl.

L is advantageously a $C_4$-$C_6$ linear alkylene group: n-butylene, n-pentylene, n-hexylene, and preferably n-butylene.

T is connected to the conjugated chain by L, preferably transports the electrons, and serves as a coordination site for the lanthanide ions. T is advantageously a neutral bidentate Lewis base that comprises two coordinating nitrogen atoms selected from the group that consists of benzimidazole-pyridine, thiabendazole, 1,10-phenanthroline, and 2,2'-bipyridine, each of these groups being able to be substituted or not. Preferably, T is selected from the group that consists of benzimidazole, thiabendazole, each of these groups being able to be substituted or not. More preferably still, T is benzimidazole-pyridine, substituted or not.

More particularly, T can be selected from among the following groups:

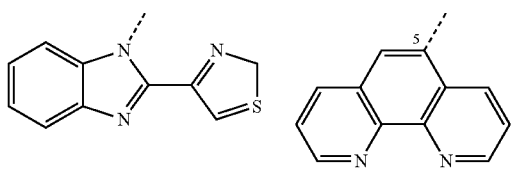

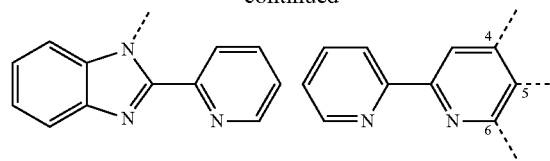

where - - - represents the attachment point to L and where each of these groups can be substituted or not. In the case of 2,2'-bipyridine, the attachment point can therefore be at the level of the carbon atom at 4-, 5- or 6-positions.

The very composition of the metallopolymers of the invention makes it possible to modulate their properties of emission and charge conduction.

It is thus possible to influence the electron transport properties and the level of lanthanide ions by varying the level of groups T.

The synthesis means of the metallopolymers of this invention therefore offers the advantage of making it possible to modulate in a controlled manner the properties of conduction of positive charges by varying the nature of the conjugated chain (carbazole/fluorene ratio), to modulate the transport of electrons by influencing the level of groups T inserted within the compound, and to modulate the emission color by acting on the ratio between the blue emission of the polymer chain and that of the lanthanide(s).

In a general manner, x is 0.01 to 0.50 and y is 0 to 0.49, with the sum of x and y always being equal to 0.50. Preferably, x is 0.01 to 0.35, and y is 0.15 to 0.49.

Preferred metallopolymers of Formula I are metallopolymers that consist of a repeat unit of Formula I'

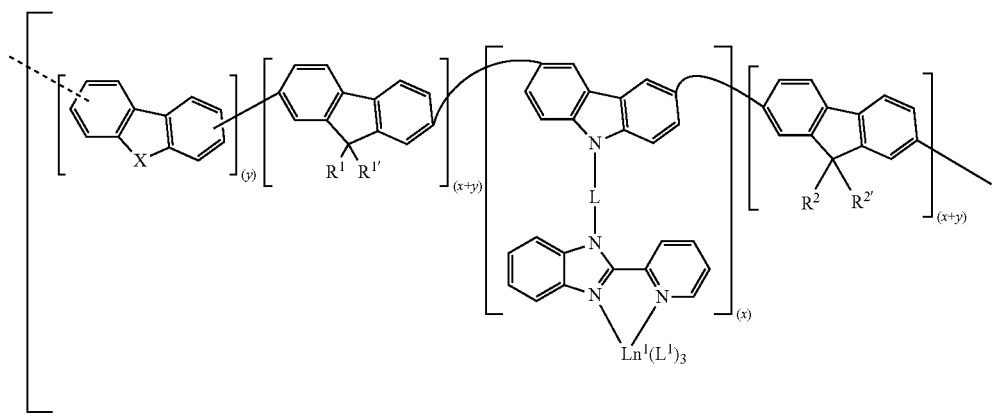

Formula I'

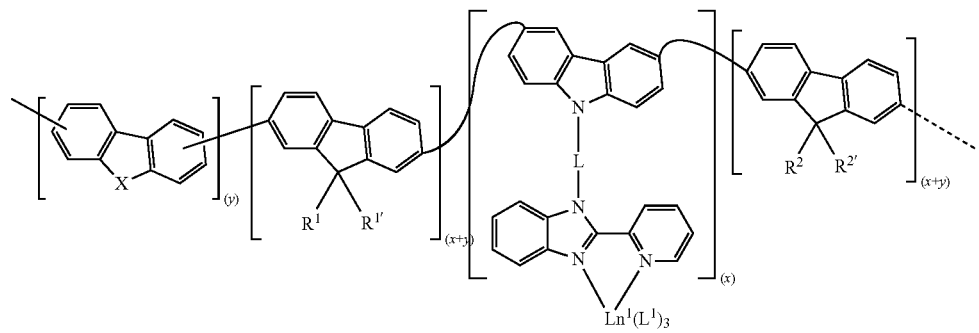

in which $R^1$, $R^{1'}$, $R^2$, $R^{2'}$, X, L, $Ln^1$, $Ln^2$, $L^1$, $L^2$, x and y are as defined above relative to Formula I.

As indicated above, it is possible to influence the properties of emission and hole transport by varying the carbazole/fluorene ratio in the conjugated chain. The conjugation between several fluorene units makes it possible to increase the blue emission; the growing presence of carbazole entities increases the hole transport.

Also, in a first variant, the metallopolymer of the invention is a metallopolymer that consists of repeat units according to Formula IA:

Formula IA

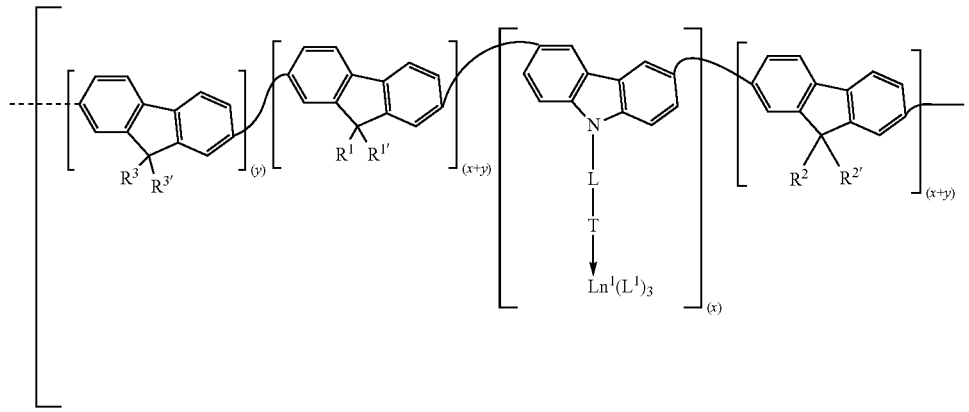

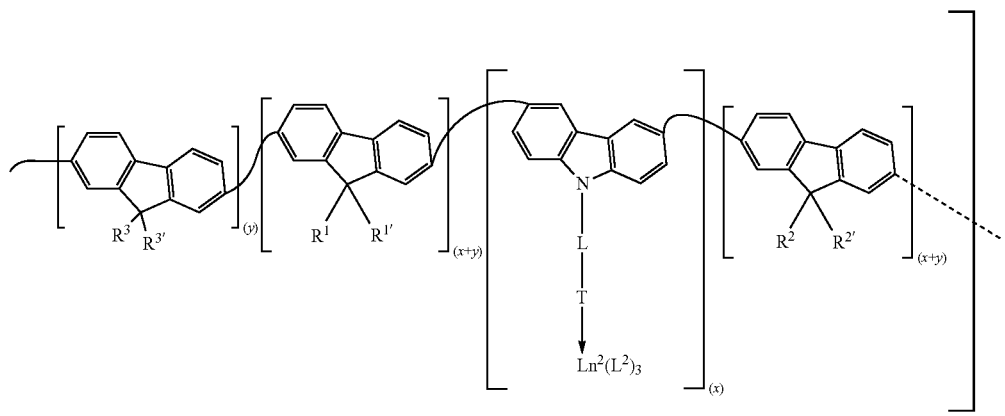

in which $R^1$, $R^{1'}$, $R^2$, $R^{2'}$, $R^3$, $R^{3'}$, L, T, $Ln^1$, $Ln^2$, $L^1$, $L^2$, x and y are as defined above relative to Formula I.

Preferred metallopolymers of Formula IA are metallopolymers that consist of a repeat unit of Formula I'A Formula I'A

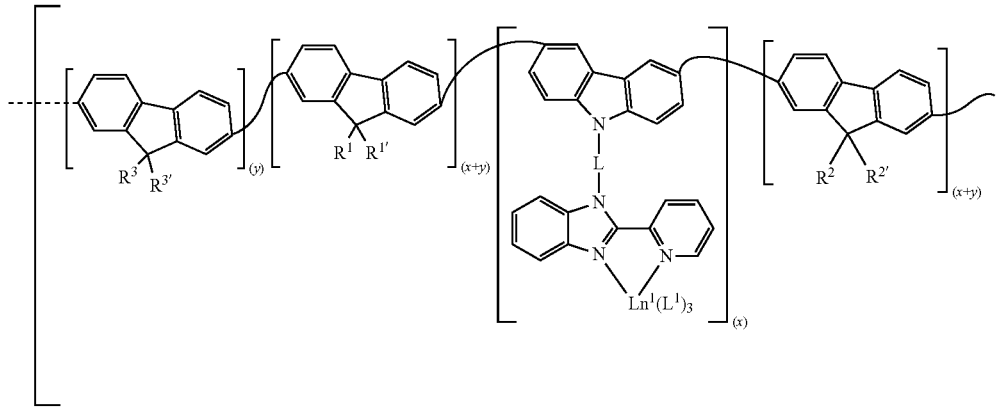

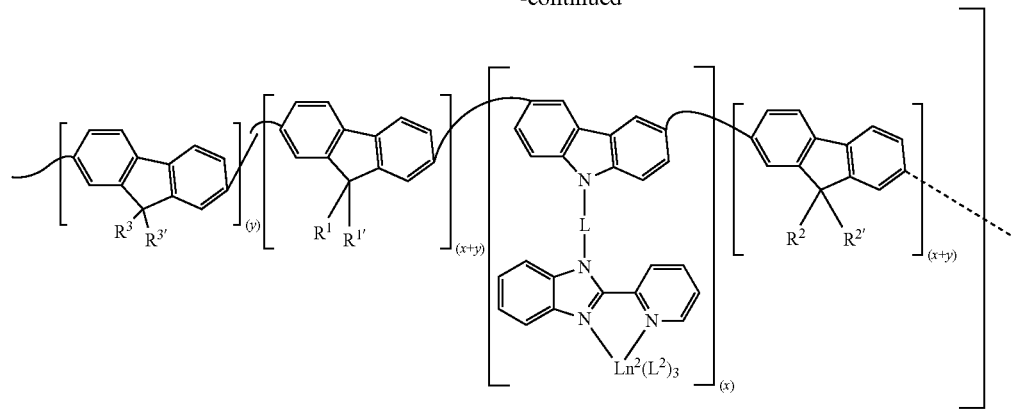

in which $R^1$, $R^{1'}$, $R^2$, $R^{2'}$, $R^3$, $R^{3'}$, L, $Ln^1$, $Ln^2$, $L^1$, $L^2$, x and y are as defined above relative to Formula I.

In a second variant, the metallopolymer of the invention is a metallopolymer that consists of repeat units according to Formula IB:

Formula IB

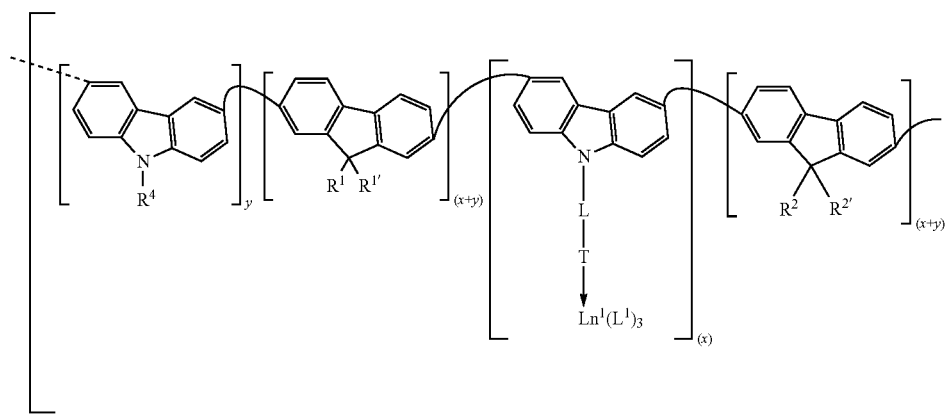

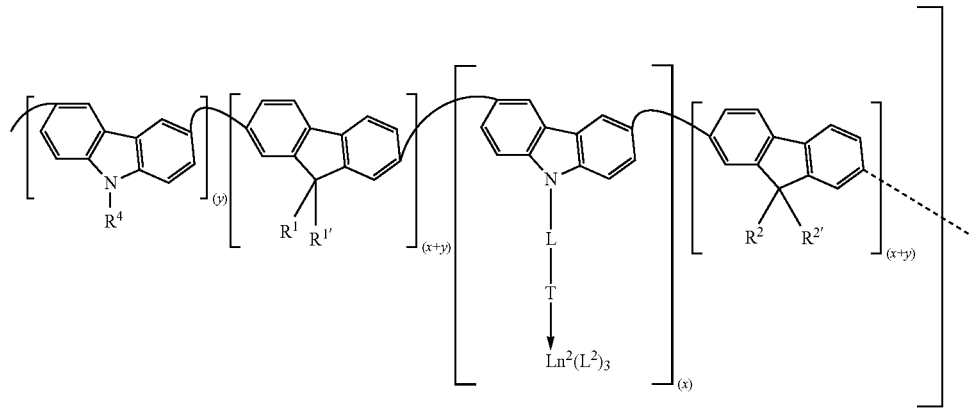

in which $R^1$, $R^{1'}$, $R^2$, $R^{2'}$, $R^4$, L, T, $Ln^1$, $Ln^2$, $L^1$, $L^2$, x and y are as defined above relative to Formula I.

Preferred metallopolymers of Formula IB are metallopolymers that consist of a repeat unit of Formula I'B

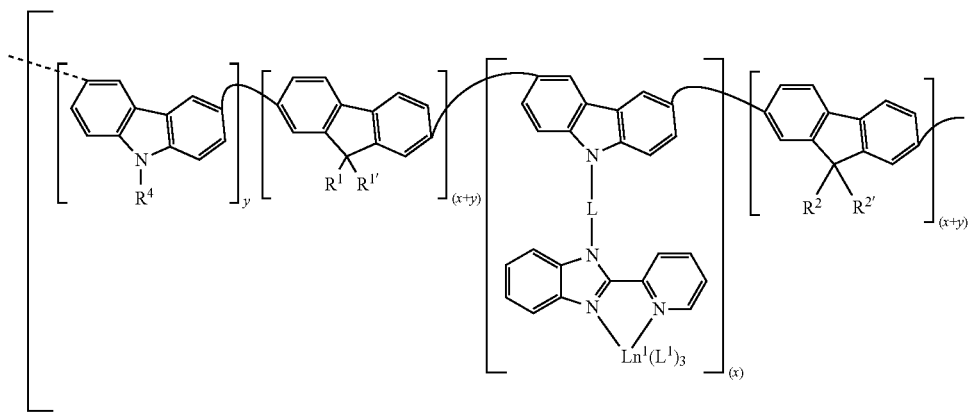

Formula I'B

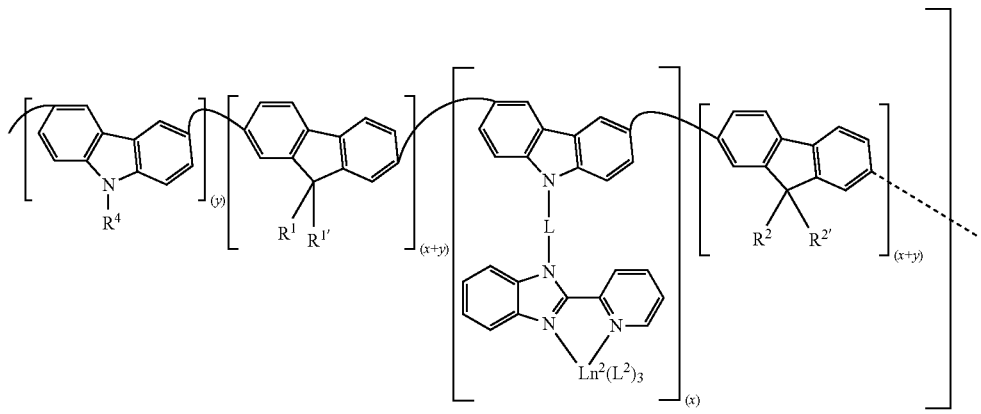

in which $R^1$, $R^{1'}$, $R^2$, $R^{2'}$, $R^4$, L, $Ln^1$, $Ln^2$, $L^1$, $L^2$, x and y are as defined above relative to Formula I.

The metallopolymers of the invention are obtained by reacting a conjugated polymer of Formula II

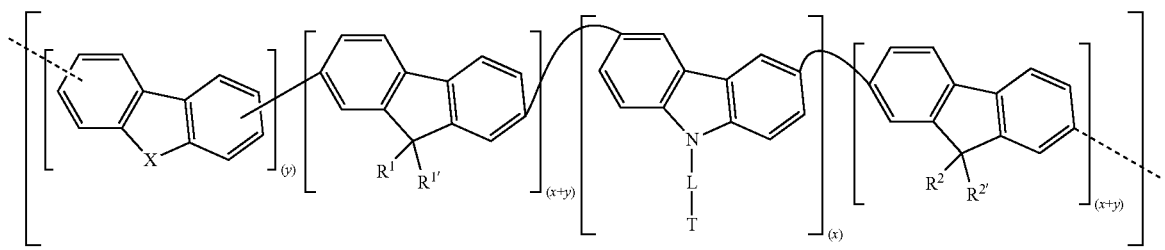

Formula II in which $R^1$, $R^{1'}$, $R^2$, $R^{2'}$, $R^3$, $R^{3'}$, $R^4$, L, T, x and y are as defined above relative to Formula I, with one or two lanthanide complexes of formula $[Ln(L)_3(H_2O)_2]$, in which Ln is selected from among the lanthanide cations and L is selected from among the β-diketonate, picolinate or dipicolinate monoanionic ligands, in an organic solvent.

The metallopolymers of Formula IA as defined above are thus obtained by reacting a conjugated polymer of Formula IIA Formula IIA

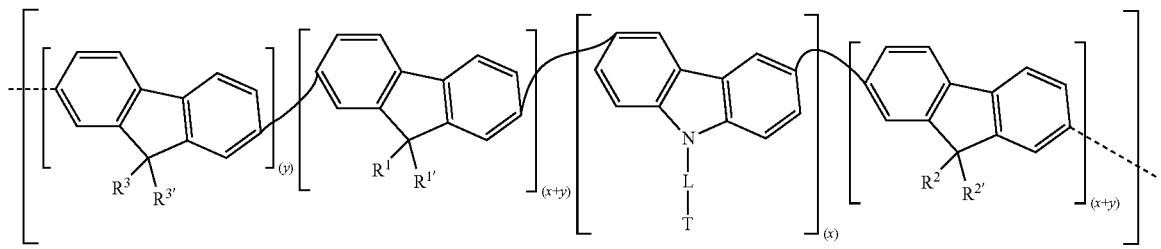

in which $R^1$, $R^{1'}$, $R^2$, $R^{2'}$, $R^3$, $R^{3'}$, L, T, x and y are as defined above relative to Formulas I and IA respectively, with one or two lanthanide complexes of formula $[Ln[(L)_3(H_2O)_2]$, in which Ln is selected from among the lanthanide cations and L is selected from among the β-diketonate, picolinate or dipicolinate monoanionic ligands, in an organic solvent.

In the same way, the metallopolymers of Formula IB are obtained as defined above by reacting a conjugated polymer of Formula IIB Formula IIB

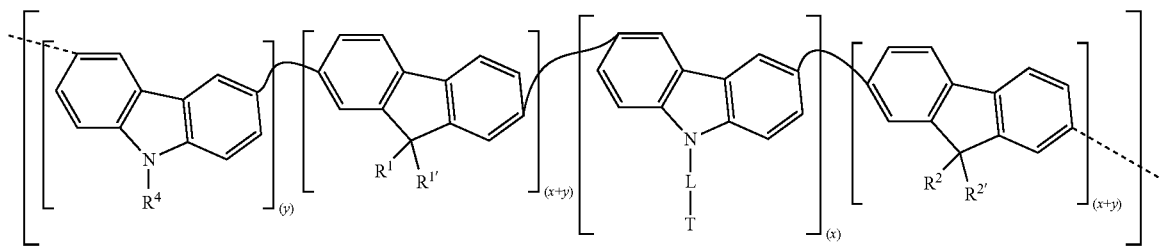

in which $R^1$, $R^{1'}$, $R^2$, $R^{2'}$, $R^4$, L, T, x and y are as defined above relative to Formulas I and IA respectively, with one or two lanthanide complexes of formula $[Ln[(L)_3(H_2O)_2]$, in which Ln is selected from among the lanthanide cations and L is selected from among the β-diketonate, picolinate or dipicolinate monoanionic ligands, in an organic solvent.

The preferred metallopolymers of Formulas I', I'A and I'B are obtained in an analogous manner starting from preferred conjugated polymers of Formulas II', II'A and II'B Formula II'

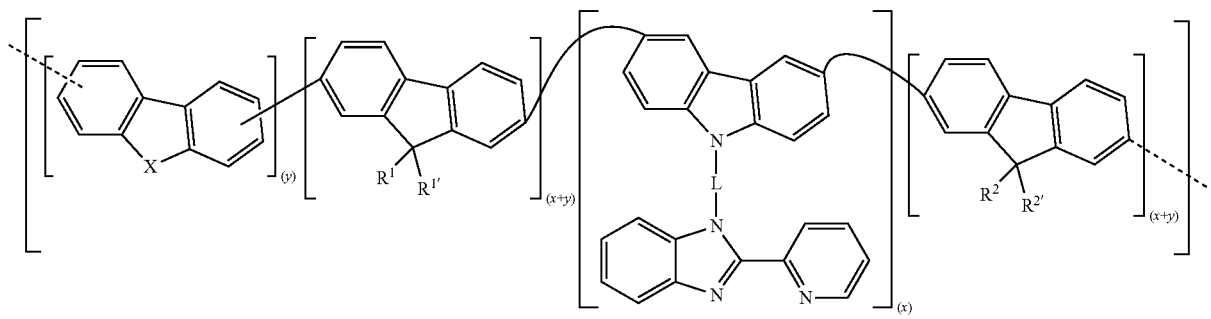

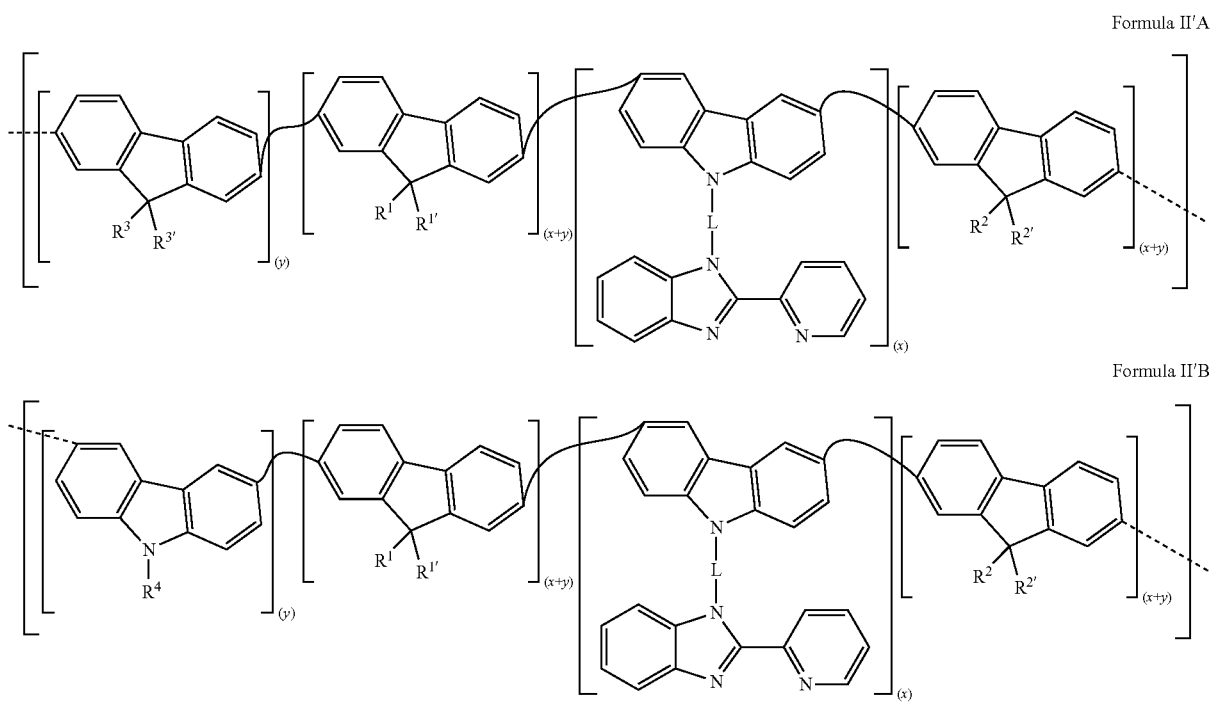

Formula II'A

Formula II'B in which X, $R^1$, $R^{1'}$, $R^2$, $R^{2'}$, $R^3$, $R^{3'}$, $R^4$, L, x and y are as defined above relative to Formula I.

The invention consequently also relates to the conjugated polymers of Formulas II, HA, IIB, II', II'A and II'B as defined above.

The conjugated polymers of the invention can be synthesized by Suzuki coupling between a boronic diester 4 that comprises a fluorene unit, a dibrominated compound 5 that comprises a fluorene unit, or a carbazole unit and a 3,6-dibromo-9-(4-(2-pyridin-2-yl-benzoimidazol-1-yl)-$C_4$-$C_6$ alkyl)-9H-carbazole compound 6.

A major advantage of the conjugated polymers of the invention resides in the fact that they may be synthesized from easily accessible monomers, in particular from commercial monomers in the case of fluorene units in which $R^1$, $R^{1'}$, $R^2$, $R^{2'}$ are n-hexyl or n-octyl.

Another advantage resides in the possibility of varying the composition of the conjugated chain by controlling the alternating groups that constitute it. Thus, the properties of charge conduction and emission can be adjusted based on the level of each of the monomers.

Owing to their properties of transport of positive and negative charges and of emission, the metallopolymers of the invention are particularly advantageous for the development of polymer light-emitting diodes. Another object of the invention is therefore the use of metallopolymers of the invention for the manufacturing of polymer light-emitting diodes. These diodes comprise a layer of a metallopolymer according to the invention that is generally placed between an anode and a cathode. In these light-emitting diodes, the metallopolymer according to the invention plays at the same time the role of electron transporter, hole transporter, and emitter material.

One advantage of the metallopolymers of the invention resides in the fact that they can be deposited by deposition techniques in solution, which is less costly than the vacuum deposition techniques and makes possible the use of larger substrates and consequently the manufacturing of larger devices.

EXAMPLES

Figure 1:
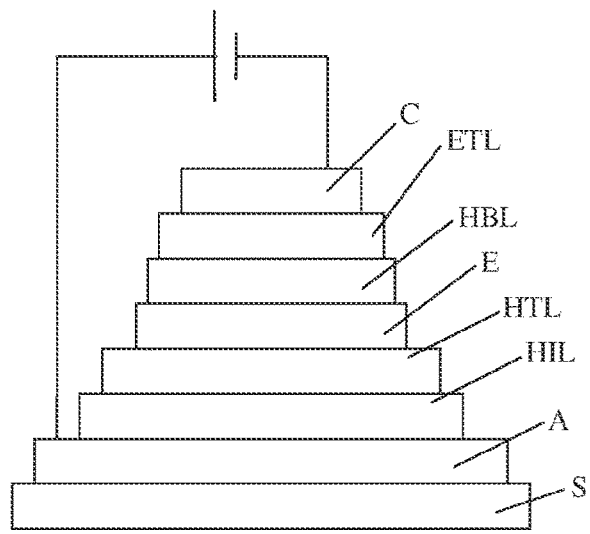
FIG. 1 is a diagrammatic representation of a multilayer organic light-emitting diode of the state of the art.

The steric exclusion chromatography (SEC) analyses were carried out on a Malvern Discotek GPC/SEC device equipped with a UV detector and a refraction index variation detector.

The thermogravimetric analyses were carried out on a Netzsch STA 409 PC Luxx® analyzing device under a stream of nitrogen. The decomposition temperature was evaluated for a loss of mass of 5%.

The photoluminescence spectra were recorded on a Jobin Yvon Fluoromax4 spectrometer. The measurements of photoluminescence yield in solution were made on a Jobin Yvon Fluorolog3 spectrometer equipped with an integration sphere.

Synthesis of 3,6-dibromo-9-(4-(2-pyridin-2-yl-benzoimidazol-1-yl)-butyl)-9H-carbazole

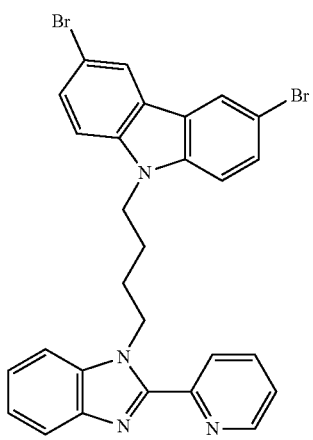 [SMILES: Brc1ccc2c(c1)c1cc(Br)ccc1n2CCCCn1c(-c2ccccn2)nc2ccccc21]

First Synthesis Stage:
3,6-Dibromo-9-(4'-bromobutyl)carbazole (1)

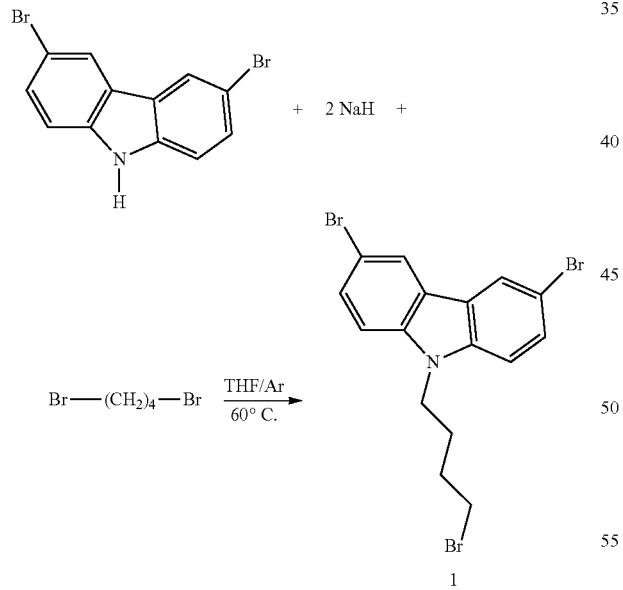

Diagram 1: Synthesis of
3,6-dibromo-9-(6'-bromobutyl)carbazole (1)

In a glovebox, 2 g (6.2 mmol) of 3,6-dibromocarbazole is dissolved in 20 ml of anhydrous THF. 295 mg (12.3 mmol) of sodium hydride is then added by small quantities to the solution. The addition of this compound brings about a strong release of gas linked to the formation of dihydrogen, entrained by the deprotonation of the 3,6-dibromocarbazole. 2.2 ml (18.5 mmol) of 1,4-dibromobutane is then added to the reaction medium using a syringe. The injection is done under a stream of argon. The reaction is carried out under inert atmosphere. The reaction mixture is stirred for 12 hours and then brought to reflux. Excess NaH is then eliminated by filtration. An extraction by dichloromethane is carried out on the filtrate. The organic phase is dried using magnesium sulfate, and the solvent is evaporated under vacuum after filtration. Finally, the final product (1) is obtained by recrystallization in ethanol. The synthesized compound is a beige solid that is obtained with a yield of 49%.

This compound was characterized by $^1$H NMR. The spectrum of 3,6-dibromo-9-(4'-bromobutyl)carbazole is provided in Attachment 1: 8.10 ppm (d, 2H, $^4$J=1.8 Hz, H1 and H4), 7.54 ppm (dd, 2H, $^3$J=8.7 Hz, $^4$J=1.8 Hz, H2 and H5), 7.23 ppm (d, 2H, $^3$J=8.7 Hz, H3 and H6), 4.25 ppm (t, 2H, $^3$J=6.3 Hz, H7 and H8), 3.36 ppm (t, 2H, $^3$J=6.3 Hz, H13 and H14), 1.93 ppm (m, 4H, H9, H10, H11 and H12).

Second Synthesis Stage: 3,6-Dibromo-9-(4-(2-pyridin-2-yl-benzoimidazol-1-yl)-butyl)-9H-carbazole (2)

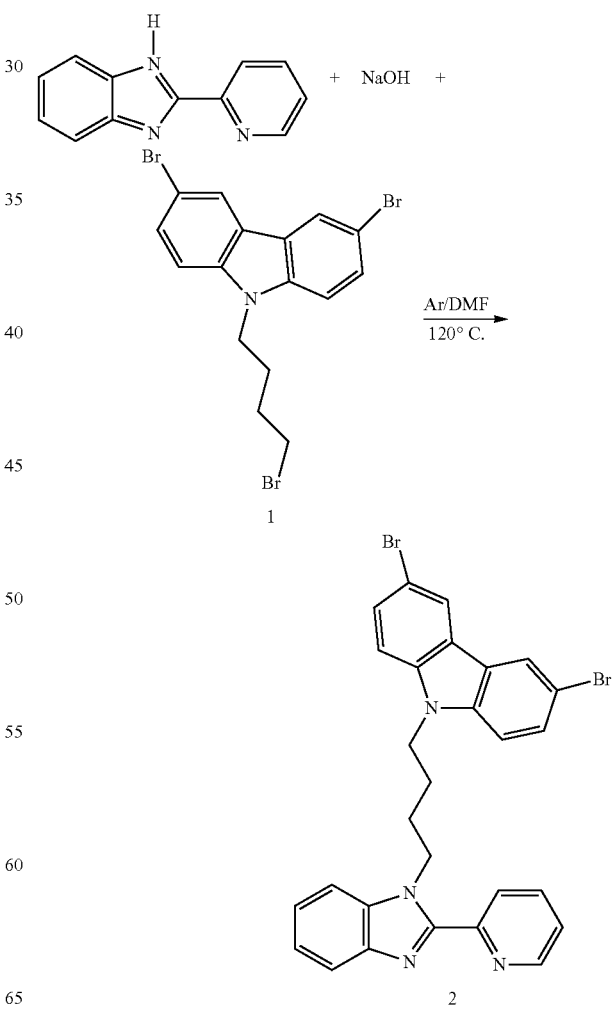

Diagram 2: Synthesis of 3,6-dibromo-9-(4-(2-pyridin-2-yl-benzoimidazol-1-yl)-butyl)-9H-carbazole (2)

The synthesis of this compound is carried out under inert atmosphere. 369 mg (1.89 mmol) of 2-(2-pyridyl)benzimidazole is dissolved in advance in 20 ml of anhydrous DMF. 113 mg (2.84 mmol) of sodium hydroxide and then 870 mg (1.89 mmol) of 3,6-dibromo-9-(6'-bromobutyl)carbazole are added to the reaction medium that is brought to reflux and stirred for 12 hours. An extraction by dichloromethane is then carried out. The organic phase is dried on magnesium sulfate. A portion of the solvent of the organic phase is evaporated under vacuum after filtration, and the compound recrystallizes under cold conditions in a very concentrated solution; it is obtained with a yield of 74%.

The overall yield that comprises the two synthesis stages presented above is 47%.

The $^1$H NMR spectrum of the compound 2 was recorded in the deuterated chloroform. It demonstrates the presence of two groups of signals: those of the hydrogen atoms of the alkyl chain and the signals of the aromatic hydrogen atoms of carbazole and of the pyridyl-benzimidazole group: 8.54 ppm (d, 1H, $^4J$=4.8 Hz, Py-H), 8.43 ppm (d, 1H, $^3J$=7.9 Hz, Py-H), 8.10 ppm (d, 2H, $^4J$=1.8 Hz, H1 and H4), 7.87 ppm (td, 2H, Py-H), 7.54 ppm (dd, 2H, $^3J$=8.7 Hz, $^4J$=1.8 Hz, H2 and H5), 7.39 ppm (m, 4H, Ar—H), 7.23 ppm (d, 2H, $^3J$=8.7 Hz, H3 and H6), 4.80 ppm (t, 2H, $^3J$=6.3 Hz, H13 and H14), 4.25 ppm (t, 2H, $^3J$=6.3 Hz, H7 and H8), 1.93 ppm (m, 4H, H9, H10, H11 and H12).

Synthesis of 3,6-dibromo-9-hexyl-9H-carbazole (3)

Diagram 3: Synthesis of 3,6-dibromo-9-hexyl-9H-carbazole (3)

In a glovebox, 1.5 g (4.6 mmol) of 3,6-dibromocarbazole is dissolved in 15 ml of anhydrous THF. 221 mg (9.2 mmol) of sodium hydride is then added by small quantities to the solution so as to prevent too violent a release of gas that is linked to the formation of dihydrogen, caused by the deprotonation of 3,6-dibromocarbazole. 1.7 ml (13.8 mmol) of 1-bromohexane is then injected into the reaction medium under a stream of argon. The reaction is carried out under inert atmosphere. The reaction mixture is stirred for 12 hours and brought to reflux at a temperature of 65° C. Excess NaH is then eliminated by filtration. An extraction by dichloromethane is carried out on the filtrate. The organic phase is dried on magnesium sulfate, and the solvent is evaporated under vacuum. The compound that is obtained comes in the form of dark beige crystals. The yield is 60%.

The $^1$H NMR spectrum of 3,6-dibromo-9-(6'-bromobutyl) carbazole was recorded in the deuterated chloroform: 8.10 ppm (d, 2H, $^4J$=1.8 Hz, H1 and H4), 7.54 ppm (dd, 2H, $^3J$=8.7 Hz, $^4J$=1.8 Hz, H2 and H5), 7.23 ppm (d, 2H, $^3J$=8.7 Hz, H3 and H6), 4.25 ppm (t, 2H, $^3J$=6.3 Hz, H7 and H8), 2.1 ppm (t, 2H, $^3J$=6.3 Hz, H15 and H16), 1.93 pm (m, 6H, H9, H10, H11, H12, H13, H14), 0.8 ppm (m, 3H, H17, H18, H19).

Synthesis of tris(2-thenoyltrifluoroacetonato)bis(aquo)europium (III): [Eu(tta)$_3$(H2O)$_2$] (4)

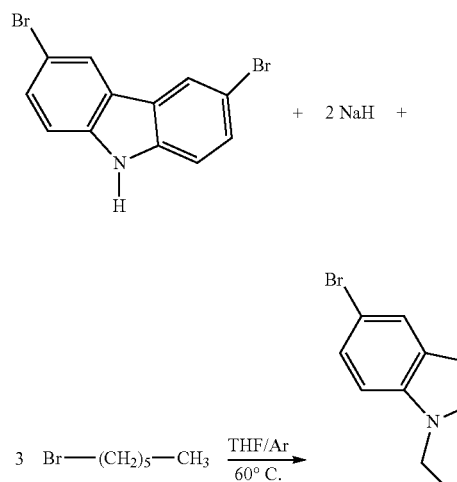

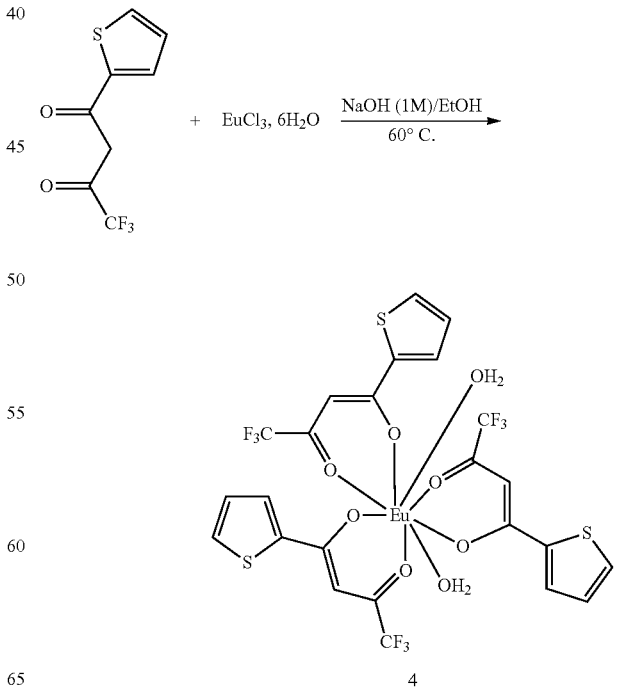

Diagram 4: Synthesis of tris(2-thenoyltrifluoroacetonato)europium(III) dihydrate (4)

1 g of Htta (4.5 mmol) is dissolved in 20 ml of absolute ethanol. 4.5 ml of an aqueous solution of sodium hydroxide with a concentration of C=1 mol·L$^{-1}$ is added to the reaction medium so as to make possible the deprotonation of β-diketone. The mixture is then stirred for one hour. 550 mg of hexahydrated europium chloride (1.5 mmol) is dissolved in 50 ml of distilled water. This solution is slowly added to the β-diketonate solution. The reaction mixture is finally stirred for 12 hours at 60° C. A precipitate that is light yellow in color forms. It is recovered by filtration and then dried under vacuum. The yield is 71%.

Synthesis of tris(2-thenoyltrifluoroacetonato){3,6-Dibromo-9-(4-(2-pyridin-2-yl-benzoimidazol-1-yl)-butyl)-9H-carbazole}europium(III): [Eu(tta)3L] (5) (with L for {3,6-Dibromo-9-(4-(2-pyridin-2-yl-benzoimidazol-1-yl)-butyl)-9H-carbazole})

Tris(2-thenoyltrifluoroacetonato) {3,6-dibromo-9-(4-(2-pyridin-2-yl-benzoimidazol-1-yl)-butyl)-9H-carbazole}europium(III) is obtained by reaction between the compound 4 and the compound 2 in THF under inert atmosphere (Diagram 5).

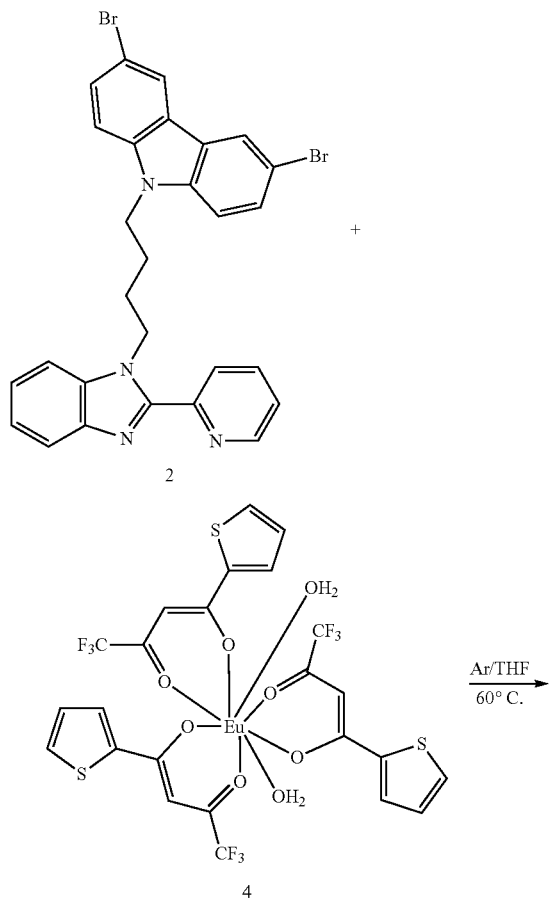

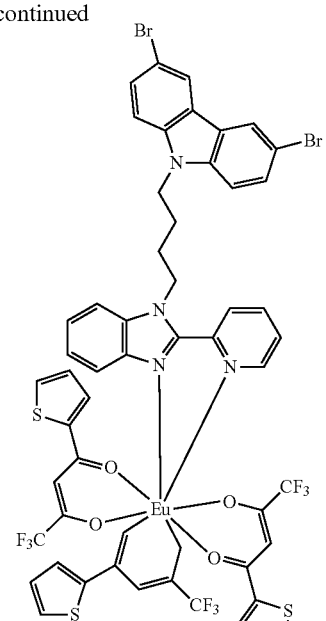

Diagram 5: Synthesis of the Eu(tta)$_3$L Complex (5)

In a glovebox, a solution of 1 g (1.16 mmol) of the Eu(tta)$_3$(H$_2$O)$_2$ complex in 10 ml of anhydrous THF is slowly added to a solution of 0.67 g of 3,6-dibromo-9-(4-(2-pyridin-2-yl-benzoimidazol-1-yl)-butyl)-9H-carbazole (1.16 mmol) in 5 ml of anhydrous THF. The reaction medium is then stirred for 12 hours at 60° C. Successive additions of several milliliters of pentane entrain the formation of a precipitate that is recovered by filtration and then dried under vacuum. The compound that is obtained is a powder that is clear beige in color, and the yield of the reaction is 51%.

The complex was characterized by elementary analysis.
AE: Calculated for: C$_{52}$H$_{34}$Br$_2$EuF$_9$N$_4$O$_6$S$_3$: C, 44.94%; H, 2.47%; N, 4.03%.
Found: C, 44.95%; H, 2.34%; N, 4.03%.

Example 1

Synthesis of a Conjugated Polymer of Formula IIA with x=0.35 and y=0.15

The palladium (0) catalyst Pd (OAc)$_2$ was formed in situ from 2.2 mg (17.8 µmol) of palladium acetate (II) and 8.9 mg (53.9 µmol) of tri-p-tolylphosphine in 15 ml of toluene. 438 mg (0.87 mmol) of bipinacolic ester of the 2,7-diboronic acid of 9,9-di-n-hexylfluorene, 350 mg (0.61 mmol) of 3,6-dibromo-9-(4-(2-pyridin-2-yl-benzoimidazol-1-yl)-butyl)-9H-carbazole, 79 mg (0.16 mmol) of 9,9-dihexyl-2,7-dibromofluorene, as well as 4.5 ml of an aqueous solution of tetraethylammonium hydroxide at 20% were added to the toluene solution that contains the catalyst. The reaction medium was brought to reflux at 120° C. for 72 hours. So as to terminate the polymer chain, 54 µl (51 µmol) of bromobenzene and 67 mg (55 µmol) of phenylboronic acid ester were successively added at 5-hour intervals. The reaction mixture that was obtained was introduced drop by drop into 200 ml of methanol. The gray precipitate was recovered by filtration and then dissolved in chloroform (50 ml). The solution was again added drop by drop into 200 ml of methanol. The solid was separated from the methanol solution by filtration and then washed with acetone in a Soxhlet for 48 hours.

The conjugated polymer that was obtained was characterized by steric exclusion chromatography (SEC): $M_n$=5,979, $M_w$=8,371, Polydispersity index I=1.4.

Example 2

Synthesis of Conjugated Polymers of Formula IIA with Different Levels of Functionalized Carbazole The following polymers of formula IIA were synthesized according to the operating mode of Example 1 by using different levels of the monomers used in Example 1: x=0.01 and y=0.49; x=0.05 and y=0.45; x=0.1 and y=0.4; x=0.2 and y=0.3; x=0.35 and y=0.15.

The conjugated polymers that were obtained were characterized by steric exclusion chromatography (SEC). The results are shown in Table 1 below.

TABLE 1

| x | y | Molecular Weight by Number (Mn) | Molecular Weight by Mass (Mw) | Polydispersity Index (I) |
|---|---|---|---|---|
| 0.01 | 0.49 | 17,560 | 27,043 | 1.5 |
| 0.05 | 0.45 | 17,727 | 38,747 | 2.2 |
| 0.10 | 0.40 | 22,593 | 60,835 | 2.7 |
| 0.20 | 0.30 | 8,997 | 10,210 | 1.1 |

Example 3

Synthesis of a Conjugated Polymer of Formula IIB with x=0.2 and y=0.3

The palladium (0) catalyst is formed in situ from 2.0 mg (15 µmol) of palladium (II) acetate and 8.2 mg (49.6 µmol) of tri-p-tolylphosphine in 10 ml of toluene. 91 mg (0.158 mmol) of 3,6-dibromo-9-(4-(2-pyridin-2-yl-benzoimidazol-1-yl)-butyl)-9H-carbazole and 98 mg (0.239 mmol) of 3,6-dibromo-9-hexyl-9H-carbazole are then added to the toluene solution. In a glovebox, 16 mg of Aliquat 336 is dissolved in 5 ml of toluene and injected under a stream of argon into the reaction medium. 255.5 mg (0.397 mmol) of bipinacolic ester from 9,9-di-n-hexylfluorene 2,7-diboronic acid and 1.5 ml of an aqueous solution of potassium carbonate with a concentration of C=2 mol·L$^{-1}$ are then added to the reaction medium that is stirred and brought to 120° C. for 72 hours. Finally, 24 µl (23 µmol) of bromobenzene and 29 mg (24 µmol) of phenylboronic acid ester are successively added at 5-hour intervals. The reaction mixture is added drop by drop into 200 ml of methanol. The solid is recovered by filtration and then dissolved in chloroform (50 ml). The solution is again added drop by drop into 200 ml of methanol. The solid conjugated polymer is recovered by filtration, dried, and then washed by acetone in a Soxhlet for 48 hours.

The conjugated polymer that is obtained was characterized by steric exclusion chromatography (SEC): $M_n$=6,553, $M_w$=10,121, polydispersity index I=1.5.

Example 4

Synthesis of a Conjugated Polymer of Formula IIB with Different Levels of Functionalized Carbazole The following polymers of Formula IIB were synthesized according to the operating mode of Example 3 by using different levels of the monomers used in Example 3: x=0.01 and y=0.49; x=0.05 and y=0.45; x=0.10 and y=0.40; x=0.35 and y=0.15; x=0.50 and y=0.

The conjugated polymers that were obtained were characterized by steric exclusion chromatography (SEC). The results are presented in Table 2 below.

TABLE 2

| Levels (x; y) | Molecular Weight by Number (Mn) | Molecular Weight by Mass (Mw) | Polydispersity Index (I) |
|---|---|---|---|
| 0.01; 0.49 | 8,998 | 13,242 | 1.5 |
| 0.05; 0.45 | 5,831 | 6,845 | 1.2 |
| 0.10; 0.40 | 6,098 | 8,591 | 1.4 |
| 0.20; 0.30 | 6,553 | 10,121 | 1.5 |
| 0.35; 0.15 | 7,837 | 11,602 | 1.5 |
| 0.50; 0.00 | 5,547 | 8,229 | 1.5 |

Example 5

Synthesis of a Metallopolymer of Formula IA with x=0.35 and y=0.65

In a glovebox, 100 mg of the conjugated polymer of Example 1 was dissolved in 10 ml of anhydrous chloroform. A solution that contains 100 mg (117 mmol) of [Eu(tta)$_3$(H$_2$O)$_2$] in 10 ml of anhydrous chloroform was added drop by drop to the one containing the organic polymer. The mixture was then stirred for 12 hours at 60° C. There is a large excess of the [Eu(tta)$_3$(H$_2$O)$_2$] complex relative to the quantity of sites to be coordinated within the polymer chain so as to force the coordination of the metal complex on all of the sites. The solvent was evaporated under vacuum. The thus recovered solid was washed by small portions of cold methanol so as to eliminate excess [Eu(tta)$_3$(H$_2$O)$_2$]. It was recovered by filtration and then dried.

The metallopolymer that was obtained was characterized by steric exclusion chromatography (SEC): $M_n$=6,811, $M_w$=8,696, polydispersity index I=1.3.

The measured mean molar mass by number ($M_n$) is greater than the one recorded for the initial conjugated polymer. This means that the hydrodynamic volume (space occupied by the macromolecules in solution) of the metallopolymers is higher than that of the conjugated polymers that have served in their synthesis. This can be explained by a steric impediment induced by the presence of Eu(tta)$_3$ groups within polymer chains. This therefore constitutes a good indication that the metal complex was well coordinated within polymer chains.

Example 6

Synthesis of a Metallopolymer of Formula IB with x=0.2 and y=0.3

In a glovebox, 100 mg of the conjugated polymer of Example 3 was dissolved in 10 ml of anhydrous chloroform. A solution that contains 60 mg (51 mmol) of [Eu(tta)$_3$(H$_2$O)$_2$] in 5 ml of anhydrous chloroform was added drop by drop to the one that contains the organic polymer. The mixture was then stirred for 12 hours at 60° C. There is a large excess of the [Eu(tta)$_3$(H$_2$O)$_2$] complex relative to the quantity of sites to be coordinated within the polymer chain so as to force the coordination of the metal complex on all of the sites. The solvent was evaporated under vacuum. The thus recovered solid was washed by small portions of cold methanol so as to eliminate the excess [Eu(tta)$_3$(H$_2$O)$_2$]. It was recovered by filtration and then dried.

The metallopolymer that was obtained was characterized by steric exclusion chromatography (SEC): M$_n$=7,039, M$_w$=10,874, polydispersity index I=1.5.

As for the metallopolymer of Example 5, the differences in value between the Mn and the Mw of the metallopolymer and the conjugated polymer that served in its synthesis confirm that the metal complex was well coordinated within the polymer chains.

Example 7

Thermogravimetric Analysis and DSC of the Conjugated Polymers and Metallopolymers Thermogravimetric analyses were carried out on the conjugated polymers of Examples 1 to 4, the corresponding metallopolymers (Examples 5 and 6), as well as on the following complexes: tris(2-thenoyltrifluoroacetonato){3,6-dibromo-9-(4-(2-pyridin-2-yl-benzoimidazol-1-yl)-butyl)-9H-carbazole}europium(III): Eu(tta)$_3$(L) with L for 3,6-dibromo-9-(4-(2-pyridin-2-yl-benzoimidazol-1-yl)-butyl)-9H-carbazole) and tris(2-thenoyltrifluoroacetonato)bis(aquo)europium(III): [Eu(tta)$_3$(H$_2$O)$_2$].

Figure 2:
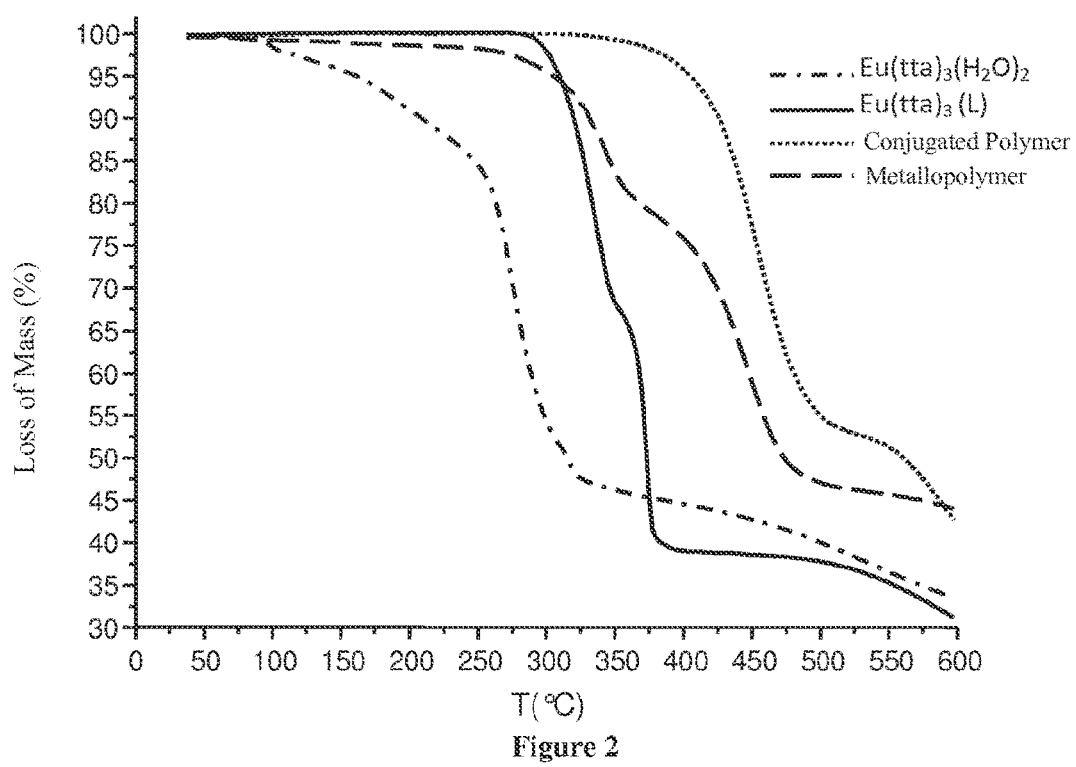
FIG. 2 shows a comparison of the ATG curves of the two metal complexes: [Eu(tta)$_3$(H$_2$O)$_2$], [Eu(tta)$_3$(L)], with that of the metallopolymer of Example 5 and that of the corresponding conjugated polymer.
Figure 3:
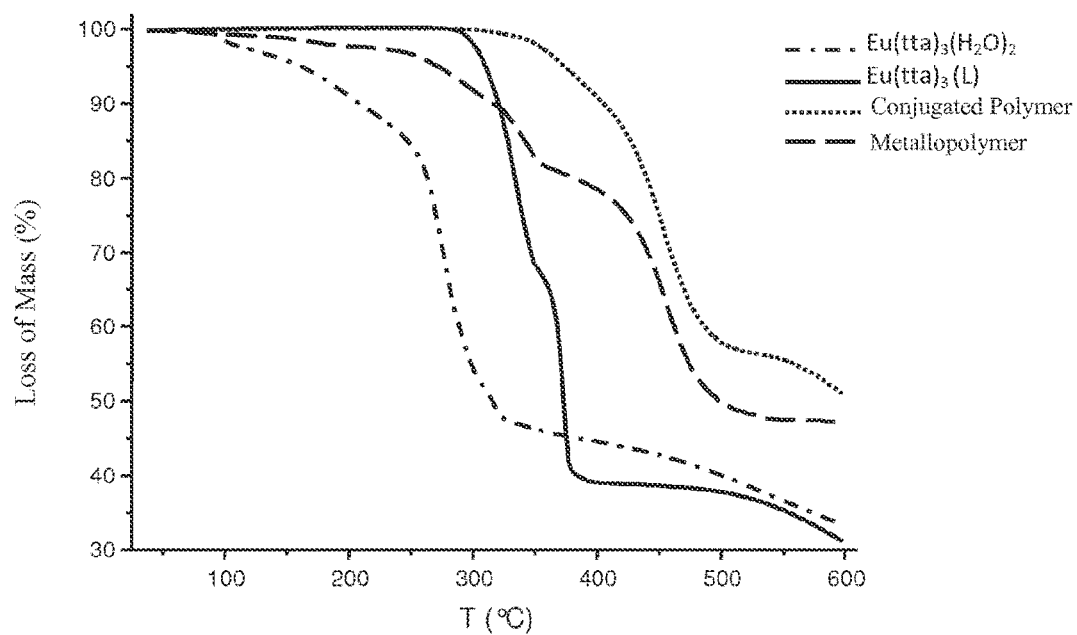
FIG. 3 shows a comparison of the ATG curves of the two metal complexes: [Eu(tta)$_3$(H$_2$O)$_2$], [Eu(tta)$_3$(L)], with that of the metallopolymer of Example 6 and that of the corresponding conjugated polymer.

FIGS. 2 and 3 show a comparison of the ATG curves of the two metal complexes: [Eu(tta)$_3$(H$_2$O)$_2$], [Eu(tta)$_3$(L)], with those of each of the two metallopolymers of Examples 5 and 6, and those of the conjugated polymers that have served in obtaining the latter.

FIG. 2 shows this comparison for the metallopolymer of Example 5: the loss of mass recorded at around 100° C. on the curve of the [Eu(tta)$_3$(H$_2$O)$_2$] complex corresponds to the loss of water molecules located in the second coordination sphere of lanthanide. The second loss of mass that is located toward 180° C. can be attributed to the loss of water molecules that are directly linked to metal. The loss of mass recorded at 320° C. that is much more consistent corresponds to the loss of two tta ligands. For the [Eu(tta)$_3$(L)] complex, the loss of mass that is recorded toward 350° C. can also be attributed to the loss of two tta ligands. On the curve of the metallopolymer, it is possible to note two significant losses of mass: a first around 350° C., which is analogous to the one observed for the [Eu(tta)$_3$(L)] complex, and a second at a higher temperature that plays a role in the conjugated polymer by itself and that is linked to the beginning of the break in the alkyl chains of the fluorene units. This comparison therefore makes it possible to demonstrate that the metallopolymer undergoes two losses of mass relative to each of the groups that constitute it: the metal complex and the organic polymer. The ATG curves therefore also confirm that the metal complex was well coordinated within the polymer chains.

FIG. 3 shows this comparison for the metallopolymer of Example 6: The ATG curve of the metallopolymer of Example 6 also shows two quite distinct losses of mass: a first that plays a role toward 350° C., corresponding to the loss of two diketonate ligands, and a second that is higher in temperature that corresponds as in the conjugated polymer to the degradation of alkyl chains grafted on the aromatic units.

Table 3 provides the values of decomposition temperatures (T$_d$) that are evaluated for each of the compounds shown in FIGS. 2 and 3. They have been measured for a loss of mass of 5%.

TABLE 3

| Characteristic of the Compound | T$_d$ (° C.) ± 1° C. |
|---|---|
| [Eu(tta)$_3$(H$_2$O)$_2$] | 162 |
| [Eu(tta)$_3$(L)] | 309 |
| Metallopolymer (Example 5) | 305 |
| Associated Conjugated Polymer (x = 0.35) | 405 |
| Metallopolymer (Example 7) | 275 |
| Associated Conjugated Polymer (x = 0.2; y = 0.3) | 374 |

The values that are presented in Table 1 show that despite the presence of a metal group, the metallopolymers have high decomposition temperatures, a significant parameter for their use in light-emitting diodes.

Example 8

Photophysical Study of Metallopolymers

The emission spectra of the metallopolymers of Examples 5 and 6 in solution have been recorded from solutions produced in the dichloromethane with a mass concentration of 100 μg/ml.

The emission spectrum of the metallopolymer of Example 6 was recorded on thin film that was obtained from a solution produced in chlorobenzene and with a mass concentration of 12 mg/ml deposited by spin-coating. The emitting layer of the light-emitting diode that is produced is deposited under analogous conditions.

Figure 4:
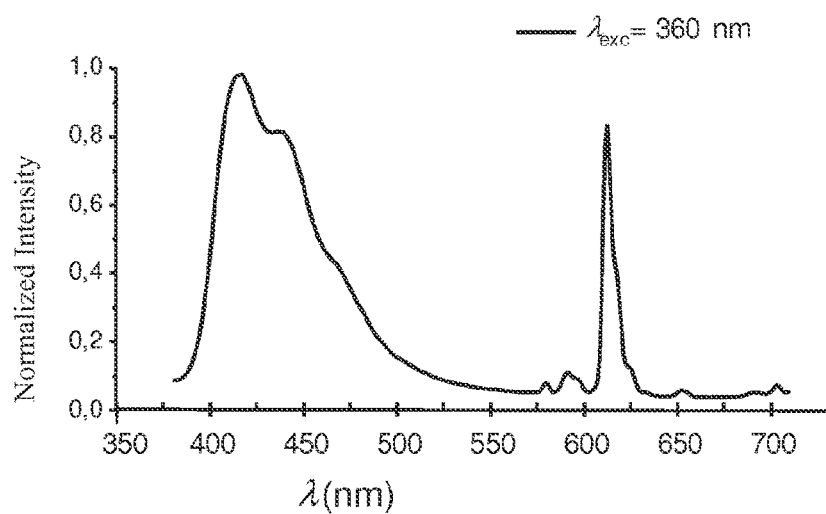
FIG. 4 shows the emission spectrum in solution of the metallopolymer of Example 5.

FIG. 4 shows the emission spectrum in solution of the metallopolymer of Example 5. It comprises two quite distinct bands, one in the blue range, similar to the one observed with the organic polymer by itself, and one in the red range, characteristic of the emission of europium(III).

Figure 5:
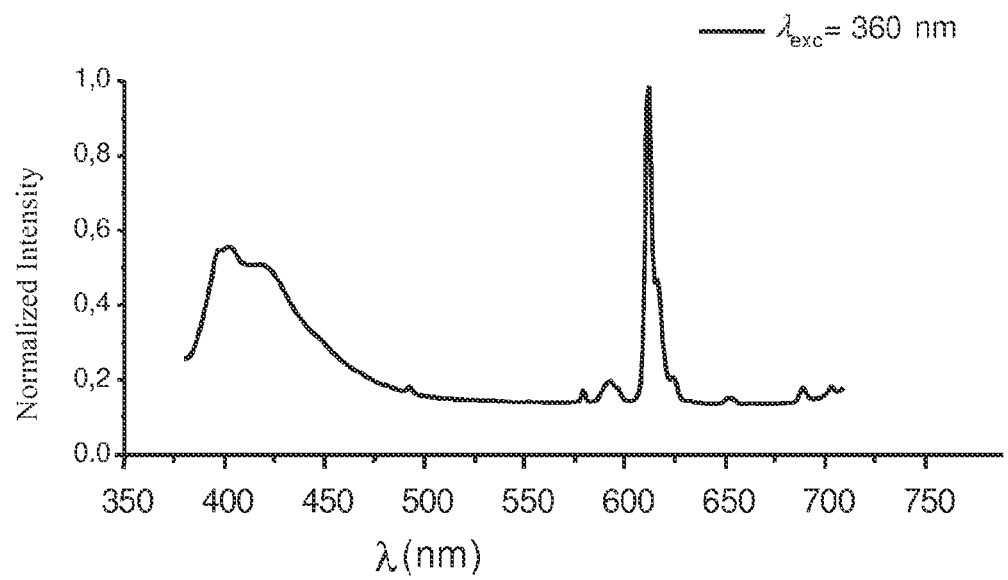
FIG. 5 shows the emission spectrum in solution of the metallopolymer of Example 6.

FIG. 5 shows the emission spectrum in solution of the metallopolymer of Example 6. It has two different bands, one in the blue range, attributable to the conjugated polymer, and the other in the red range that is characteristic of europium(III), with the band recorded in the red range being the most intense.

Figure 6:
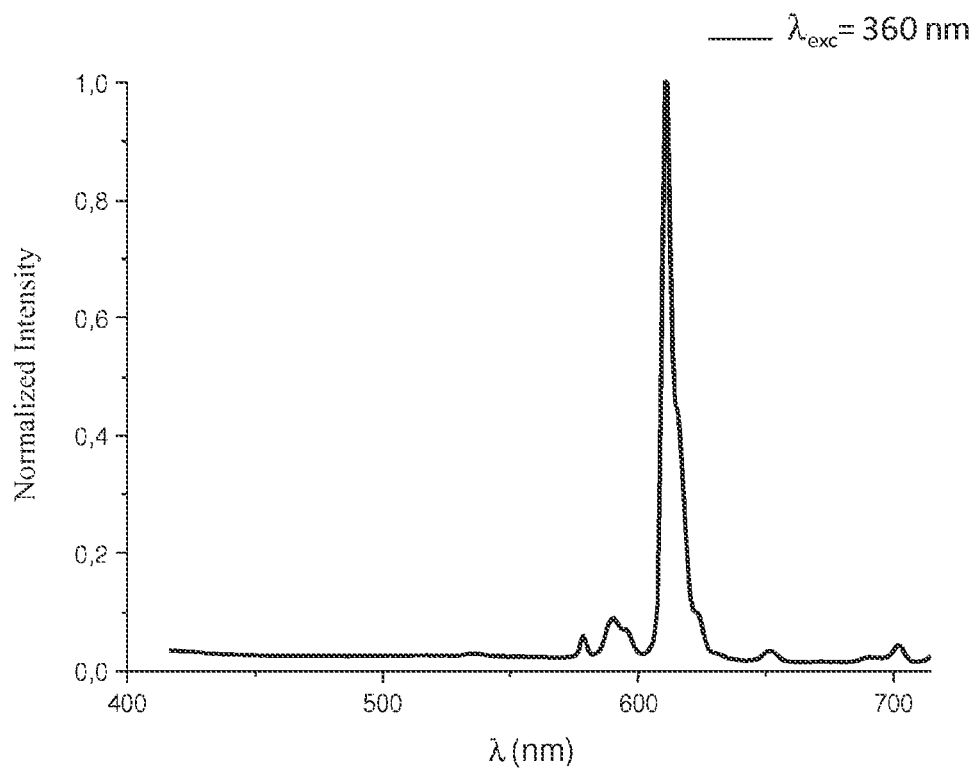
FIG. 6 shows the thin-film emission spectrum of the metallopolymer of Example 6.

FIG. 6 shows the thin-film emission spectrum of the metallopolymer of Example 6.

Example 9

Polymer Light-Emitting Diode (PLED)

Figure 7:
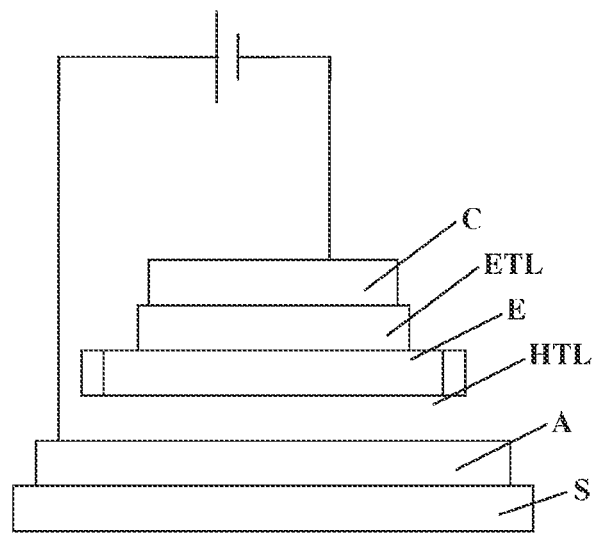
FIG. 7 is a diagrammatic representation of a light-emitting diode of Example 9.

A polymer light-emitting diode was produced with the metallopolymer of Example 6. This diode, shown diagrammatically in FIG. 7, successively comprises the following on a glass substrate (S): an indium-tin oxide (ITO) 100 nm anode (A), a PEDOT-PSS 40 nm hole transporting layer (HTL), a metallopolymer 100 nm layer of Example 6 (E), a TPBI 50 nm electron transporting layer (ETL), and a LiF/Al 100 nm cathode (C).

Figure 8:
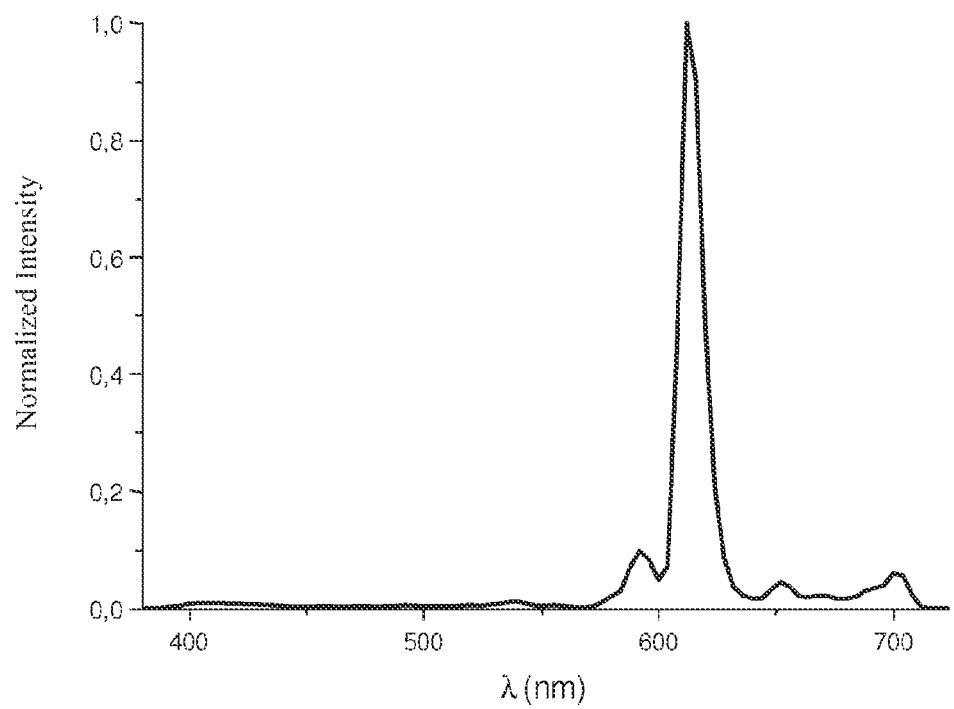
FIG. 8 shows the light-emitting spectrum of a polymer light-emitting diode according to the invention.

The device with this structure has a red emission color. The light-emitting spectrum is shown in FIG. 8.

The invention claimed is:
1. A metallopolymer consisting of repeat units of Formula I

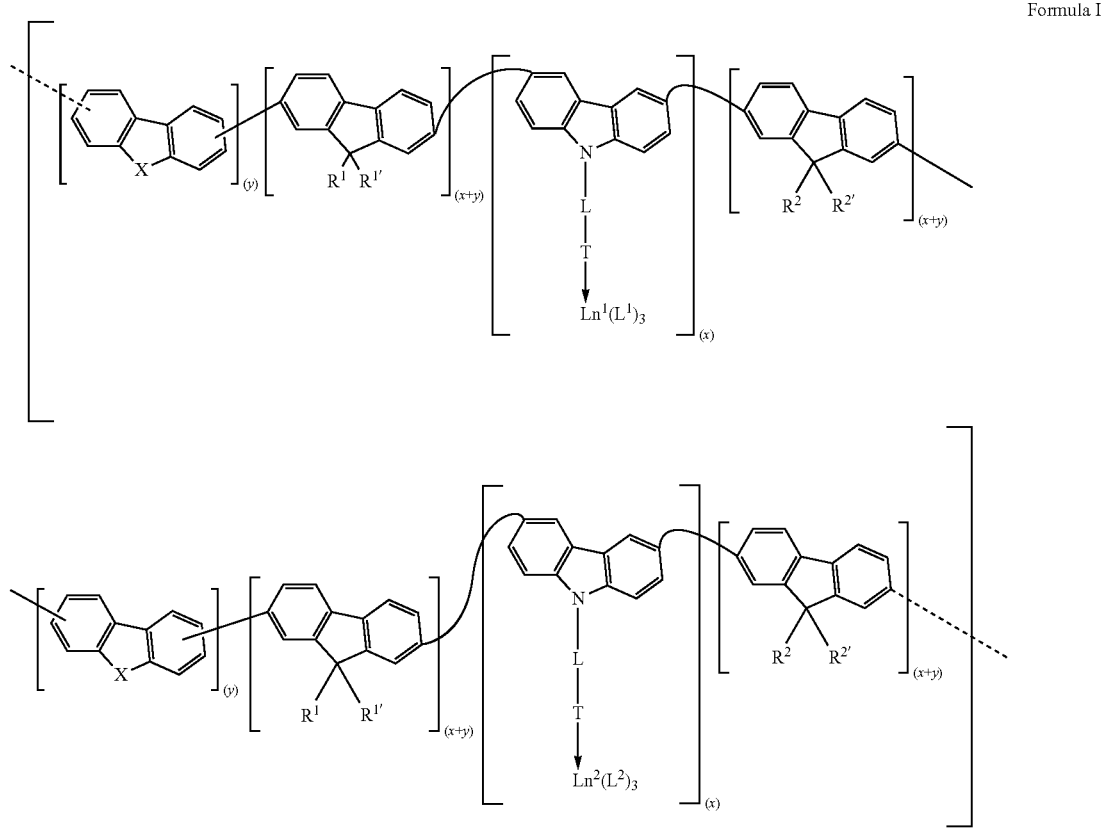

Formula I in which
R$^1$ and R$^{1'}$ are, independently of one another, a C$_2$-C$_{10}$ alkyl group;
R$^2$ and R$^{2'}$ are, independently of one another, a C$_2$-C$_{10}$ alkyl group;
X is CR$^3$R$^{3'}$ or NR$^4$;
R$^3$ and R$^{3'}$ are, independently of one another, a C$_2$-C$_{10}$ alkyl group;
R$^4$ is a C$_2$-C$_{10}$ alkyl group;
L is a C$_4$-C$_{10}$ alkylene group;
T is a neutral bidentate Lewis base that comprises two coordinating nitrogen atoms;
→ shows a coordination of the group T via the two nitrogen atoms from T to Ln$^1$ and Ln$^2$ respectively;
Ln$^1$ and Ln$^2$ are, independently of one another, selected from among the lanthanide cations;
L$^1$ and L$^2$ are, independently of one another, selected from among the β-diketonate, picolinate or dipicolinate monoanionic ligands;
x is from 0.01 to 0.50;
y is from 0 to 0.49, with the sum of x +y being equal to 0.50.

2. The metallopolymer according to claim 1, consisting of repeat units of Formula IA

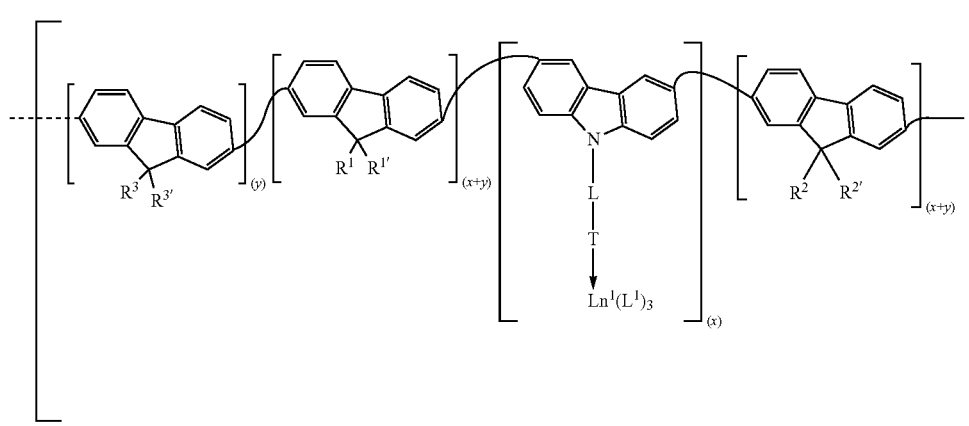

Formula IA

-continued

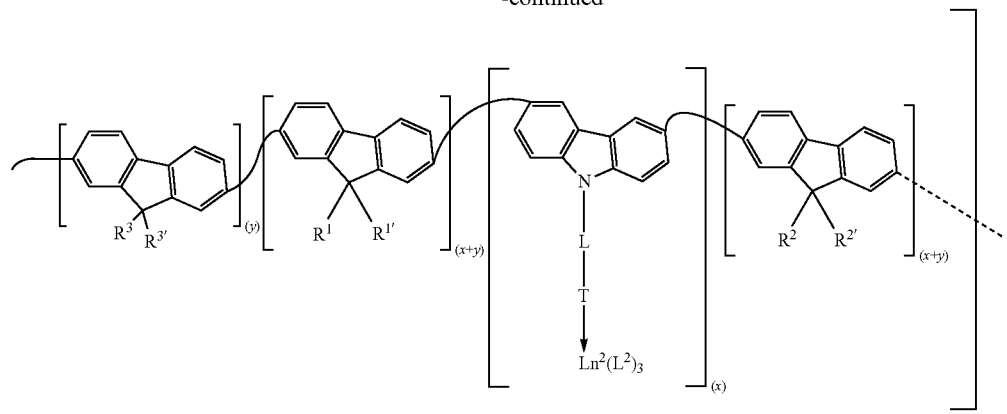

in which $R^1$, $R^{1'}$, $R^2$, $R^{2'}$, $R^3$, $R^{3'}$, L, T, $Ln^1$, $Ln^2$, $L^1$, $L^2$, x and y are as previously defined.

3. The metallopolymer according to claim 1, consisting of repeat units of Formula IB Formula IB

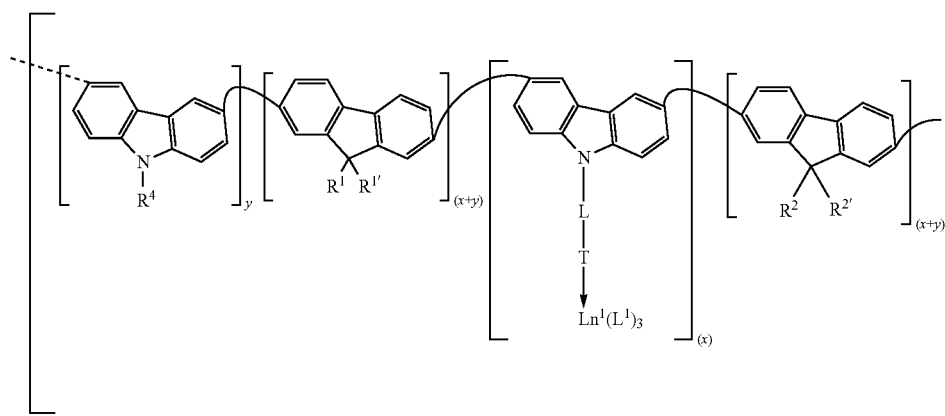

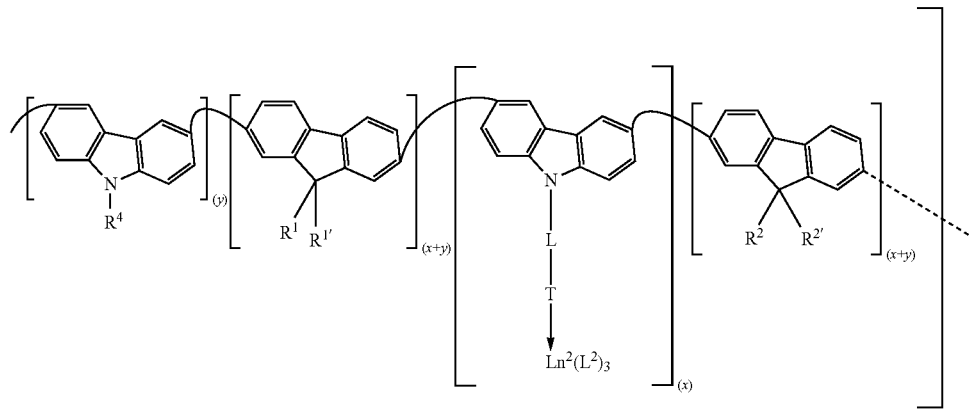

in which $R^1$, $R^{1'}$, $R^2$, $R^{2'}$, $R^4$, L, T, $Ln^1$, $Ln^2$, $L^1$, $L^2$, x, y, and n are as previously defined.

4. The metallopolymer according to claim 1, consisting of repeat units of Formula I'

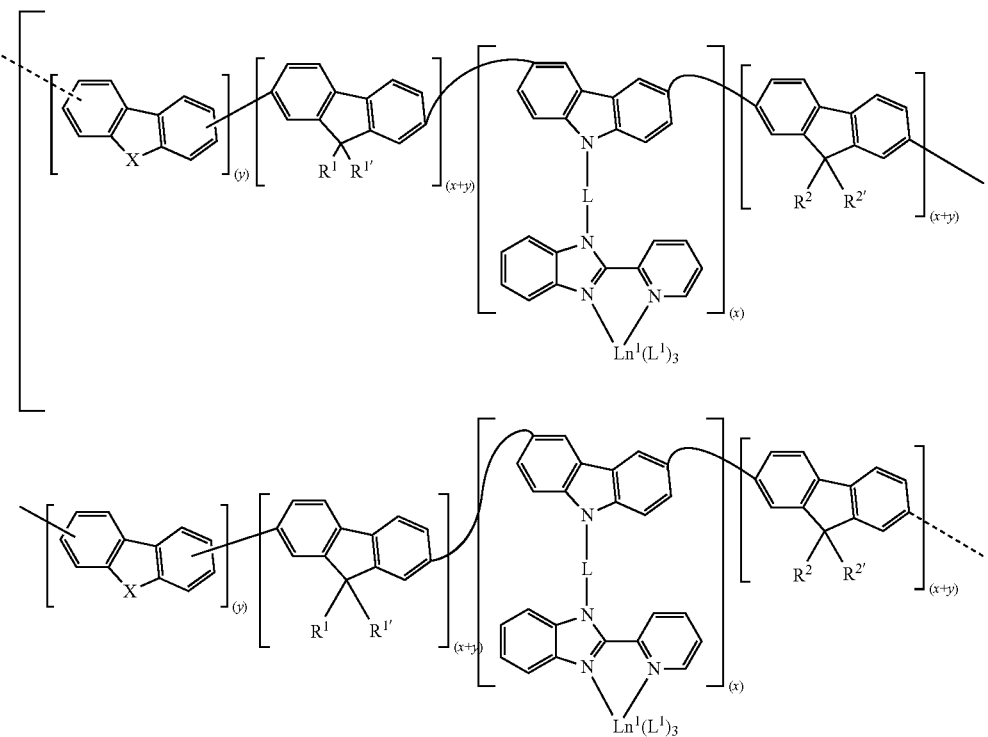

Formula I' in which $R^1$, $R^{1'}$, $R^2$, $R^{2'}$, X, L, $Ln^1$, $Ln^2$, $L^1$, $L^2$, x and y are as previously defined.

5. The metallopolymer according to claim 1, in which $R^1$ and $R^{1'}$ are n-octyl.

6. The metallopolymer according to claim 1, in which $R^2$ and $R^{2'}$ are n-octyl.

7. The metallopolymer according to claim 1, in which L is n-butylene.

8. The metallopolymer according to claim 1, in which $Ln^1$ and $Ln^2$ are both $Eu^{3+}$, and $L^1$ and $L^2$ are both thenoyltrifluoroacetonate.

9. The metallopolymer according to claim 1, in which $Ln^1$ is $Eu^{3+}$ and $Ln^2$ is $Tb^{3+}$, and $L^1$ and $L^2$ are both thenoyltrifluoroacetonate.

10. A conjugated polymer consisting of repeat units of Formula II in which
$R^1$ and $R^{1'}$ are, independently of one another, a $C_2$-$C_{10}$ alkyl group;
$R^2$ and $R^{2'}$ are, independently of one another, a $C_2$-$C_{10}$ alkyl group;
X is $CR^3R^{3'}$ or $NR^4$;
$R^3$ and $R^{3'}$ are, independently of one another, a $C_2$-$C_{10}$ alkyl group;
$R^4$ is a $C_4$-$C_{10}$ alkyl group;
x is from 0.01 to 0.50;
y is from 0 to 0.49, with the sum of x +y being equal to 0.50;
L is a $C_4$-$C_{10}$ alkylene group;
T is a neutral bidentate Lewis base that comprises two coordinating nitrogen atoms.

11. A method of manufacturing a polymer light-emitting diode which comprises placing a metallopolymer according to claim 1 between an anode and a cathode.

12. A light-emitting_diode comprising a layer of a metallopolymer according to claim 1.

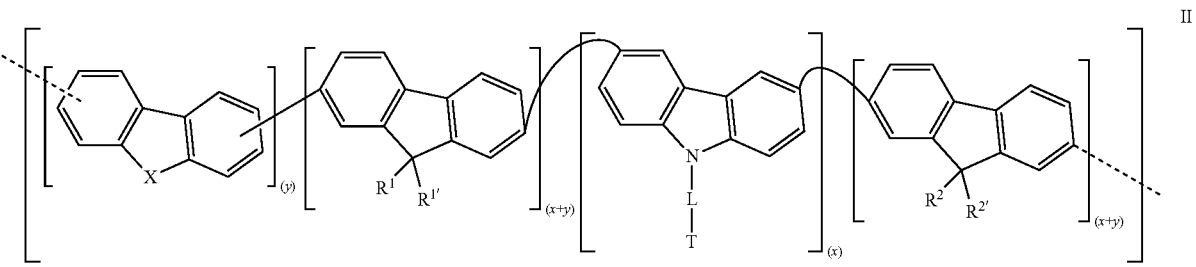

II

13. The metallopolymer_according to claim 2, in which $R^1$ and $R^{1'}$ are n-octyl.

14. The metallopolymer_according to claim 2, in which $R^2$ and $R^{2'}$ are n-octyl.

15. The metallopolymer according to claim 2, in which L is n-butylene.

16. The metallopolymer according to claim 2, in which $Ln^1$ and $Ln^2$ are both $Eu^{3+}$, and $L^1$ and $L^2$ are both thenoyltrifluoroacetonate.

17. The metallopolymer according to claim 2, in which $Ln^1$ is $Eu^{3+}$ and $Ln^2$ is $Tb^{3+}$, and $L^1$ and $L^2$ are both thenoyltrifluoroacetonate.

\* \* \* \* \*